(12) United States Patent
Shin et al.

(10) Patent No.: US 11,669,395 B2
(45) Date of Patent: *Jun. 6, 2023

(54) MEMORY SYSTEM INCLUDING FIELD PROGRAMMABLE GATE ARRAY (FPGA) AND METHOD OF OPERATING SAME

(71) Applicant: SAMSUNG ELECTRONICS CO., LTD., Suwon-si (KR)

(72) Inventors: Dong-Min Shin, Seoul (KR); Hong-Rak Son, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 10 days.

This patent is subject to a terminal disclaimer.

(21) Appl. No.: 17/499,499

(22) Filed: Oct. 12, 2021

(65) Prior Publication Data
US 2022/0035703 A1 Feb. 3, 2022

Related U.S. Application Data

(63) Continuation of application No. 16/547,425, filed on Aug. 21, 2019, now Pat. No. 11,169,874.

(30) Foreign Application Priority Data

Dec. 6, 2018 (KR) .......................... 10-2018-0156277

(51) Int. Cl.
*G06F 11/10* (2006.01)
*H03M 13/09* (2006.01)
*H03M 13/11* (2006.01)
*G06F 7/58* (2006.01)
*G11C 11/409* (2006.01)
*G11C 29/52* (2006.01)
*G06F 13/16* (2006.01)

(52) U.S. Cl.
CPC ............ *G06F 11/1068* (2013.01); *G06F 7/58* (2013.01); *G06F 13/1668* (2013.01); *G11C 11/409* (2013.01); *G11C 29/52* (2013.01); *H03M 13/095* (2013.01); *H03M 13/1105* (2013.01)

(58) Field of Classification Search
CPC ........ G06F 11/10; G06F 11/1068; G06F 7/58; G06F 13/1668; H03M 13/29; H03M 13/095; H03M 13/1105; G11C 11/409; G11C 29/52
See application file for complete search history.

(56) References Cited

U.S. PATENT DOCUMENTS 7,533,253 B2 * 5/2009 Jo .......................... G06F 9/4403 713/2
8,225,181 B2 * 7/2012 Perlmutter .............. G06F 11/10 714/748

(Continued)

*Primary Examiner* — Guy J Lamarre
(74) *Attorney, Agent, or Firm* — Volentine, Whitt & Francos, PLLC

(57) ABSTRACT

A memory system includes; a memory device, a memory controller including a first interface, a second interface, and a first data processor having a first error correction code (ECC) engine, and a field programmable gate array (FPGA) including a third interface connected to the first interface, a fourth interface connected to the second interface, a fifth interface connected to an external host, and a second data processor having a second ECC engine. The memory controller may configure a normal write operation path or highly reliable write operation path.

20 Claims, 18 Drawing Sheets

(56) References Cited

U.S. PATENT DOCUMENTS

| | | | |
|---|---|---|---|
| 8,495,465 B1 | 7/2013 | Anholt et al. | |
| 8,726,140 B2* | 5/2014 | Chang | H03M 13/6356 |
| | | | 714/800 |
| 8,862,967 B2 | 10/2014 | Pancholi et al. | |
| 9,230,687 B2 | 1/2016 | Cordero et al. | |
| 9,342,402 B1 | 5/2016 | Ong et al. | |
| 9,430,326 B2 | 8/2016 | Barndt | |
| 9,654,148 B2 | 5/2017 | Zhao et al. | |
| 9,798,622 B2 | 10/2017 | Motwani | |
| 10,021,143 B2 | 7/2018 | Cabrera et al. | |
| 10,628,364 B2 | 4/2020 | Shim | |
| 11,006,167 B2* | 5/2021 | Shin | H04N 21/42221 |
| 11,169,874 B2* | 11/2021 | Shin | G11C 29/52 |
| 2006/0117206 A1* | 6/2006 | Boldyrev | G06F 9/5027 |
| | | | 714/2 |
| 2008/0117282 A1* | 5/2008 | Cho | H04N 7/141 |
| | | | 348/E7.078 |
| 2010/0232550 A1 | 9/2010 | Lee et al. | |
| 2012/0317463 A1* | 12/2012 | Sugahara | H03M 13/05 |
| | | | 714/E11.032 |
| 2015/0046771 A1 | 2/2015 | Kim et al. | |
| 2016/0156671 A1 | 6/2016 | Cabrera et al. | |
| 2016/0315635 A1 | 10/2016 | Cai et al. | |
| 2016/0328289 A1* | 11/2016 | Zhang | G06F 3/064 |
| 2017/0279464 A1 | 9/2017 | Noh et al. | |
| 2018/0083654 A1 | 3/2018 | Baty | |
| 2018/0101450 A1* | 4/2018 | Park | G06F 13/4282 |

* cited by examiner

MEMORY SYSTEM INCLUDING FIELD PROGRAMMABLE GATE ARRAY (FPGA) AND METHOD OF OPERATING SAME

CROSS-REFERENCE TO RELATED APPLICATION

This is a Continuation of U.S. application Ser. No. 16/547,425, filed Aug. 21, 2019, now U.S. Pat. No. 11,169,874 issued Nov. 9, 2021, and a claim of priority under 35 U.S.C. § 119 is made to Korean Patent Application No. 10-2018-0156277 filed on Dec. 6, 2018 in the Korean Intellectual Property Office, the subject matter of which is hereby incorporated by reference.

BACKGROUND

The inventive concept generally relates to a data processing systems and memory systems included in data processing systems. More particularly, the inventive concept relates to memory systems including a field programmable gate array (FPGA), as well as methods of operating such memory systems.

Flash memory is a form of non-volatile memory capable of reliably retaining stored data in the absence of applied power. Storage devices including flash memory (e.g., an embedded Multi-Media Card (eMMC), a Universal Flash Storage (UFS), a Solid State Drive (SSD), and memory card) have become widely used components particularly well suited to the storing and retrieval of large amounts of data. As such storage devices have become widely used, methods of prolonging their useful lifespan have been continuously studied.

SUMMARY

The inventive concept provides a memory system including a memory controller including a first data processor and a field programmable gate array (FPGA) including a second data processor, as well as a memory device.

According to an aspect of the inventive concept, a memory system includes; a memory device, a memory controller comprising a first interface, a second interface, and a first data processor configured to perform a first data processing on read data retrieved from the memory device and output first-processed read data via one of the first interface and the second interface, and a field programmable gate array (FPGA) comprising a third interface connected to the first interface, a fourth interface connected to the second interface, a fifth interface connected to an external host, and a second data processor configured to perform a second data processing on the first-processed read data and output second-processed read data to the external host via the fifth interface.

According to another aspect of the inventive concept, a memory system includes; a memory device, a memory controller comprising a first interface, a second interface, and a first data processor including a first error correction code (ECC) engine, and a field programmable gate array (FPGA) comprising a third interface connected to the first interface, a fourth interface connected to the second interface, a fifth interface connected to an external host, and a second data processor including a second ECC engine. The memory controller is configured to determine whether a write operation requested by the external host is a normal write operation or a highly reliable write operation. Upon determining that the write operation is a normal write operation, the memory controller configures a normal write operation path between the external host and the memory device including; the fifth interface, the fourth interface, the second interface, the first ECC engine, else upon determining that the write operation is a highly reliable write operation, the memory controller configures a highly reliable write operation path between the external host and the memory device including; the fifth interface, the second ECC engine, the third interface, the first interface, and the first ECC engine.

According to another aspect of the inventive concept, a method of operating a memory system is provided. The memory system includes a memory controller including a first data processor including a first error correction code (ECC) engine, a field programmable gate array (FPGA) including a second ECC engine and operating in response to program, and a non-volatile memory device. The method includes; selecting between a normal read path and a highly reliable read path in response to a read request received from an external host, upon selecting the highly reliable path, performing a first ECC decoding on read data retrieved from the non-volatile memory device to provide first-processed data, performing a second ECC decoding on the first-processed data to provide second-processed data, and providing the second-processed data to the external host, else upon selecting the normal path, performing only the first ECC decoding on the read data to provide the first-processed data, and providing the first-processed data to the external host.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, certain embodiments of the inventive concept will be described in some additional detail with reference to the accompanying drawings.

Figure 1:
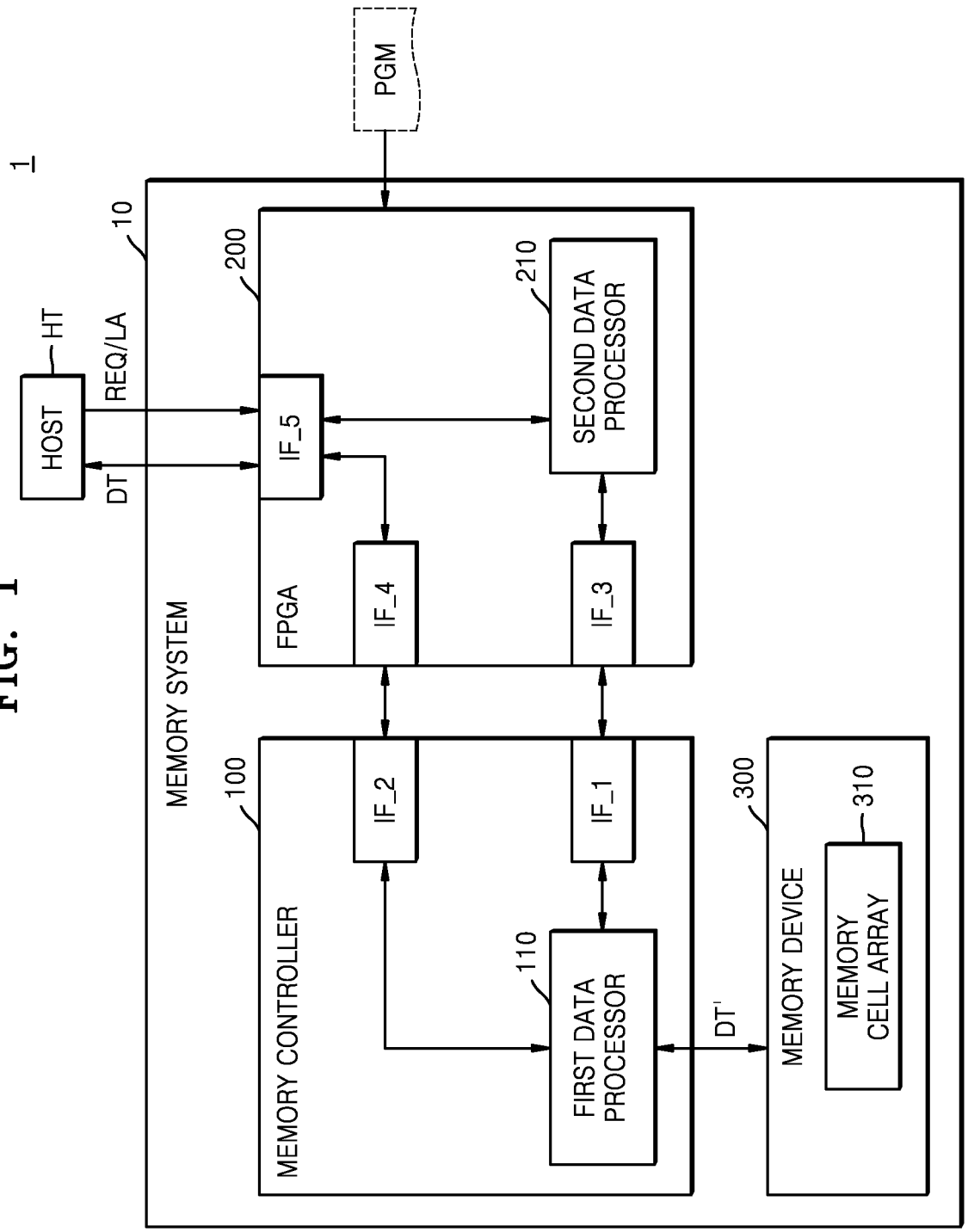
FIG. 1 is a block diagram illustrating a data processing system including a memory system according to an example embodiment.

FIG. 1 is a block diagram illustrating a data processing system including a memory system according to an example embodiment.

A data processing system 1 may be embedded in an electronic device, or may be implemented as an electronic device. The electronic device may be implemented as, for example, a personal computer (PC), a data server, an ultra mobile PC (UMPC), a workstation, a netbook, network-attached storage (NAS), a smart television, an Internet of Things (IoT) device, or a portable electronic device. The portable electronic device may include a laptop computer, a mobile phone, a smart phone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, a wearable device, or the like.

Referring to FIG. 1, the data processing system 1 may include a host HT and a memory system 10. The host HT may store data in the memory system 10 and read data from the memory system 10. The host HT may refer to a data processing device capable of processing data, such as a central processing unit (CPU), a processor, a microprocessor, an application processor (AP), or the like. For example, the host HT may be implemented as a system-on-chip (SoC).

As will be appreciated by those skilled in the art, the host HT may variously communicate (i.e., transmit and/or receive at least one of a command, control signal, address and/or data) with the memory system 10 via one or more interfaces. For example, the host HT may transmit an appropriate access request REQ to the memory system 10 in order to read data from the memory system 10 or write data to the memory system 10. In this regard, an access request (e.g., a read request or a write request) may commonly include an address identifying the location of read data to be retrieved from the memory system 10, or an intended location for storing write data in the memory system 10. Thus, the address may be (e.g.,) a logical address (LA) provided by the host HT.

Accordingly, the memory system 10 may operate in response to a write request REQ received from the host HT to store data DT received from the host HT, or operate in response to a read request REQ received from the host HT to retrieve data DT stored in the memory system 10. The data DT received from the host HT may be user data, and in this manner the memory system 10 may serve as a storage device for the host HT.

The memory system 10 may be implemented as one or more storage devices according to one or more host interface protocol(s) controlling communication between the host HT and the memory system 10. For example, the memory system 10 may be internal memory embedded in an electronic device. The memory system 10 may be implemented as one or more of (e.g.,) an embedded Multimedia Card (eMMC), MMC, SSD, UFS, embedded UFS, reduced-size MMC (RS-MMC), micro-MMC, Compact Flash (CF) card, Secure Digital (SD) card, Micro-SD card, Mini-SD card, extreme Digital (xD) card, Smart Media card, and/or Memory Stick.

In the illustrated example of FIG. 1, the memory system 10 includes a memory controller 100, a field programmable gate array (FPGA) 200, and a memory device 300. In an example embodiment, the memory controller 100, FPGA 200, and memory device 300 may be integrated into a single semiconductor device.

The memory device 300 may include a memory cell array 310 and may further include circuits performing write and read operations in relation to the memory cell array 310 under the control of the memory controller 100. For example, assuming that the memory cell array 310 includes flash memory cells, the memory device 300 may operate as a flash memory device, and the memory system 10 may be understood as a flash memory system. However, the inventive concept is not limited thereto, and the memory cell array 310 may alternately or additionally include resistive memory cells, such as resistive random access memory (ReRAM), phase change RAM (PRAM), and magnetic RAM (MRAM).

In an example embodiment, each memory cell included in the memory cell array 310 may be a single level cell (SLC) storing 1-bit data. In another example embodiment, each memory cell included in the memory cell array 310 may be a multi-level cell (MLC) storing 2 or more-bit data. For example, each memory cell included in the memory cell array 310 may be a triple level cell (TLC) storing 3-bit data or a quadruple level cell (QLC) storing 4-bit data.

In an example embodiment, the memory cell array 310 may be a 2-dimensional memory array implemented as NAND flash memory having a 2-dimensional horizontal structure. In another example embodiment, the memory cell array 310 may be a 3-dimensional (3D) memory array implemented as NAND flash memory having a 3D vertical structure. The 3D memory array is monolithically formed at least one physical level of memory cell arrays, which have an active region on a silicon substrate and a circuit formed on or in the substrate as a circuit related to operations of memory cells. The term "monolithic" used herein means that layers of each level constituting the array are stacked directly on layers of each underlying level of the array. In one embodiment, the 3D memory array includes vertical NAND strings, in which at least one memory cell is arranged on another memory cell in a vertical direction. The at least one memory cell may include a charge trap layer. Appropriate configuration for a 3D memory array, in which a 3D memory array includes a plurality of levels and word lines and/or bit lines are shared between the levels, are described, for example, in U.S. Pat. Nos. 7,679,133; 8,553,466; 8,654, 587, and 8,559,235, as well as published U.S. Patent Application No. 2011/0233648 which are hereby collectively incorporated by reference.

In the illustrated embodiment of FIG. 1, the memory controller 100 includes a first interface IF_1, a second interface IF_2, and a first data processor 110. In addition, the FPGA 200 includes a third interface IF_3, a fourth interface IF_4, a fifth interface IF_5, and a second data processor 210. Here, the first interface IF_1 and third interface IF_3 may be variously configured to exchange command(s), address(es), data and/or control signals (hereafter, singularly or in combination "CAD signals"). Similarly, the second interface IF_2 and fourth interface IF_4 may be variously configured to exchange CAM signals. Further, the fifth interface IF_5 may be used to exchange CAD signals between the host HT and the memory system 10.

As will be appreciated by those skilled in the art, any one of the first, second, third, fourth and fifth interfaces IF_1 to IF_5 may be variously configured according to one or more interface protocols, such as those associated with the Universal Serial Bus (USB), MMC, Peripheral Component Interconnect Express (PCI-E), Advanced Technology Attachment (ATA), Serial-ATA, Parallel-ATA, Small Computer System Interface (SCSI), Enhanced Small Device Interface (ESDI), Integrated Drive Electronics (IDE), etc. Although not shown, the memory controller 100 may include further interface(s) directly connecting the host HT to exchange various externally provided signals.

The memory controller 100 may control the memory device 300 such that write data DT is written to the memory device 300 or read data DT' stored in the memory device 300 is retrieved. For example, in response to an appropriate write/read request received from the host HT via the second interface IF_2, and after passing through the FPGA 200, the memory controller 100 may output various signals controlling the memory device 300 such that the write data DT' provided from the host HT is written to the memory device 300, or read data DT' identified by the host HT is retrieved from the memory device 300.

In an example embodiment, the first data processor 110 may perform a first data processing on read data DT' retrieved from the memory device 300 to provide first-processed read data to one of the first and second interfaces IF_1 and IF_2. Alternately or additionally, the first data processor 110 may perform the first data processing on write data received from one of the first and second interfaces IF_1 and IF_2 to provide first-processed write data to be stored by the memory device 300. In this regard, the first data processor 110 may include at least one of an error correction code (ECC) engine, a signal processor, a randomizer, an encryptor/decryptor, a calculator, etc.

In FIG. 1 the FPGA 200 is described as one example of a class of programmable semiconductor device(s) that may be included in various example embodiments. Here, a programmable semiconductor device may be any device capable of performing one or more operations based on (e.g.,) one or more externally provided program(s) PGM (e.g., user provided setting(s), input(s) and/or program(s). In this regard, the FPGA 200 should be broadly understood as programmable semiconductor device. In an example embodiment, the second data processor 210 included in the FPGA 200 may perform a second data processing on data received via the third interface IF_3 and providing second-processed data to the fifth interface IF_5. Thus, during certain memory system operations the second data processor 210 may perform the second data processing on read data DT' provided from the memory device 300 data or write data provided by the host HT. For example, the second data processor 210 may perform the second data processing on write data DT received from the fifth interface IF_5 in order to provide second-processed write data to the third interface IF_3. The second-processed write data may thus be provided by the third interface IF_3 to the first data processor 110 through the first interface IF_1 in order to undergo the first data processing. Thus, write data DT received from the host HT may sequentially undergo the second data processing and the first data processing before being written as the write data DT' to the memory device 300. Here again, the second data processor 210 may variously include at least one of an ECC engine, a signal processor, a randomizer, an encryptor/decryptor, and a calculator.

Alternately in another example embodiment, the FPGA 200 may directly transfer write data DT received from the host HT via the fifth interface IF_5 to the memory controller 100 via the fourth interface IF_4 without being processed by the second data processor 210. Accordingly, the write data DT may undergo only the first data processing before being written as data DT' in the memory device 300.

In relation to the illustrated embodiment of FIG. 1, the first and second data processors 110 and 210 may be respectively implemented in various forms in the memory controller 100 and the FPGA 200. For example, each of the first and second data processors 110 and 210 may be implemented in hardware, software, or a combination of software and hardware, such as firmware.

Given the memory system 10 illustrated in FIG. 1 and including the FPGA 200 with the second data processor 210, it is possible to perform write/read operations in many different ways and using various approaches. That is, data may be written or read, as between the host HT and the memory device 300, using a selected "path" from among multiple different path(s) variously including at least one of the first, second, third, fourth, and fifth interfaces IF_1 to IF_5, and further including at least one of the first data processor 110 and the second data processor 210. This flexibility of data movement, data storage and data processing provides a great degree of freedom and expanded, efficient data processing capabilities.

Figure 2:
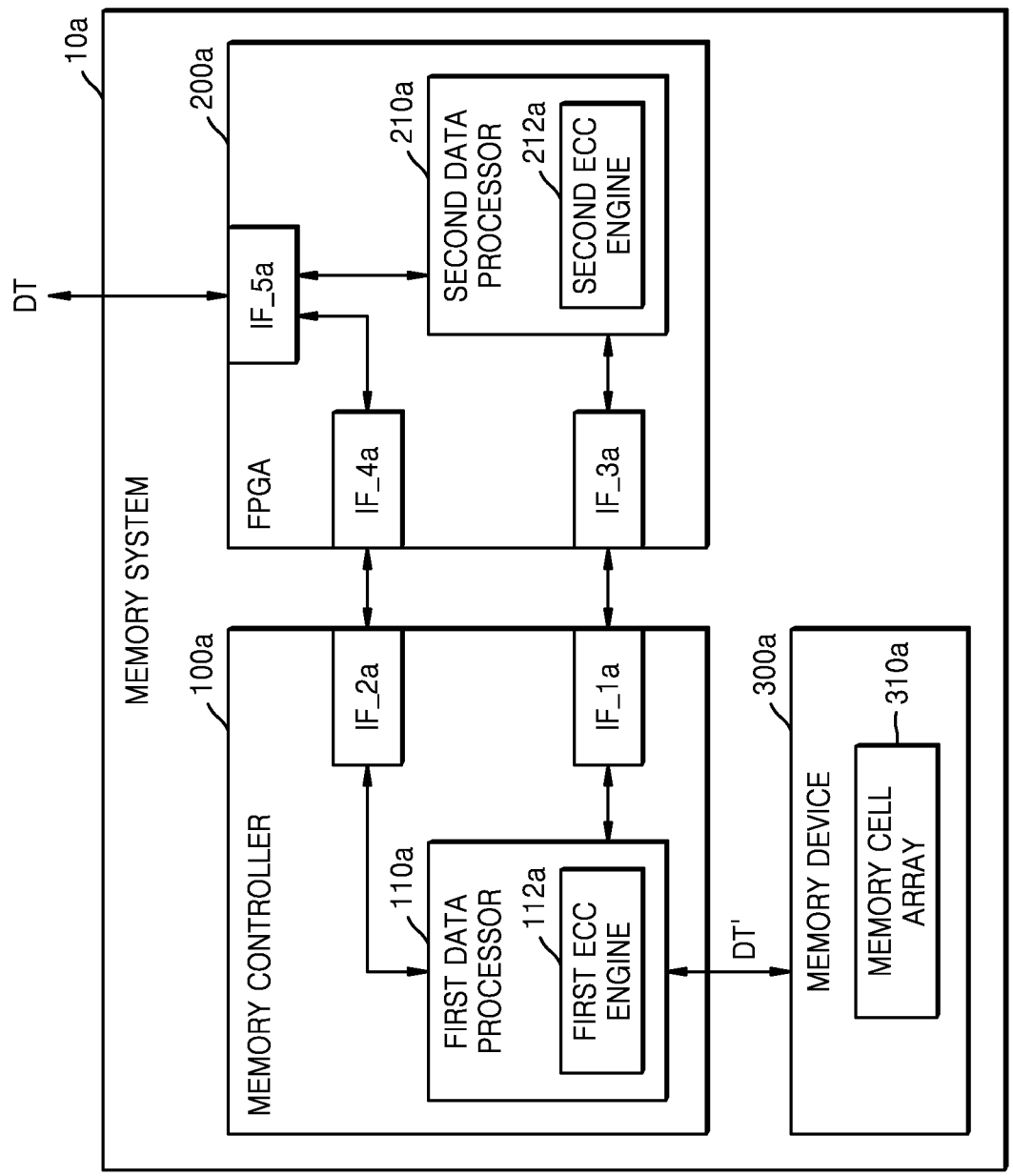
FIG. 2 is a block diagram illustrating a memory system according to an example embodiment.

FIG. 2 is another block diagram illustrating a memory system according to an example embodiment.

Referring to FIG. 2, a first data processor 110a may include a first ECC engine 112a, and a second data processor 210a may include a second ECC engine 212a. In an example embodiment, the first ECC engine 112a may perform first ECC encoding on data received from one of a first interface IF_1a and a second interface IF_2a and may perform first ECC decoding on the data DT' read from a memory device 300a. In addition, in an example embodiment, the second ECC engine 212a may perform second ECC encoding on the data DT received via a fifth interface IF_5a and may perform second ECC decoding on data received via a third interface IF_3a. For example, each of the first ECC engine 112a and the second ECC engine 212a may perform ECC encoding and ECC decoding operations based on an algorithm such as a low density parity check (LDPC) code, a Reed-Solomon (RS) code, a Hamming code, or a cyclic redundancy check (CRC) code.

In an example embodiment, a memory system 10a may select either a "normal path" or a "highly reliable path" depending on a desired degree of ECC encoding. In this regard, the normal path may provide less ECC encoding (and therefore less data security) than the highly reliable path, but may do so with lower data latency.

In the context of the illustrated example of FIG. 2, the normal path may connect the memory device 300a with the host HT through the first data processor 110a, the second interface IF_2a, the fourth interface IF_4a, and the fifth interface IF_5a. Hence, write/read data passing through the normal path may undergo ECC encoding or ECC decoding using the first ECC engine 112a. In contrast, the highly reliable path may connect the memory device 300a with the host HT through the first data processor 110a, the first interface IF_1a, the third interface IF_3a, the second data processor 210a, and the fifth interface IF_5a. Hence, write/read data passing through the highly reliable path may undergo successive ECC encoding by the first ECC engine 112a and the second ECC engine 212a.

Figure 3A:
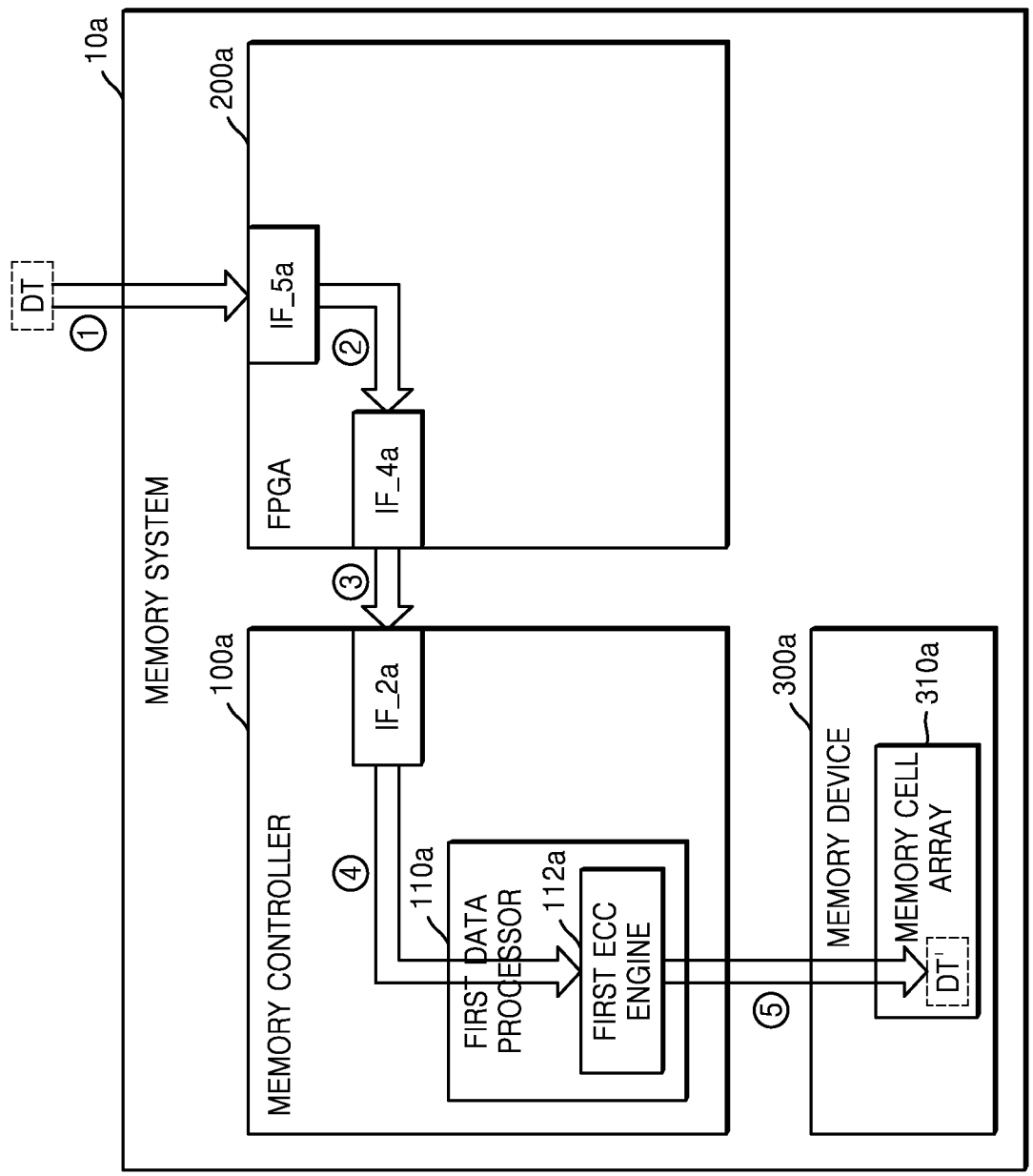
FIGS. 3A and 3B are respective conceptual diagrams illustrating the movement of data in relation to various example embodiments.
Figure 3B:
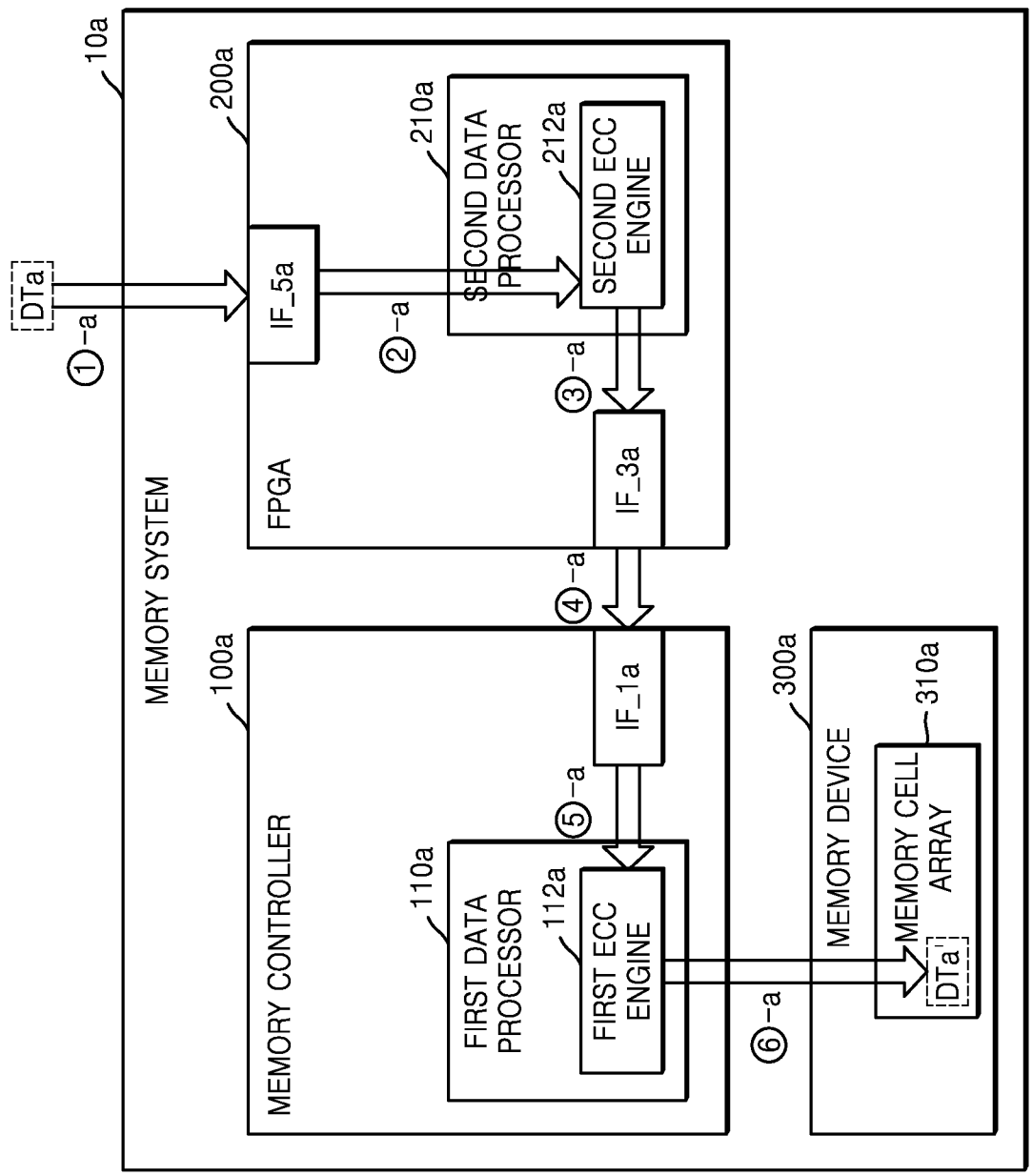

FIGS. 3A and 3B are respective conceptual diagrams illustrating the movement of data according to example embodiments. More particularly, FIG. 3A illustrates the movement of write data through a normal path of memory system 10a, and FIG. 3B illustrates the movement of write data through a highly reliable path of memory system 10a.

Referring to FIG. 3A, write data DT is received by the memory system 10a from an external host HT via the fifth interface IF_5a (①). (Hereafter, the term "external host" is used to denote a broad range of data sources and/or data destinations that may be associated with a memory system consistent with an embodiment of the inventive concept). The write data DT is then transferred to the fourth interface IF_4a (②) and provided to the memory controller 100a through the fourth interface IF_4a (③) and the second interface IF_2a. That is, the memory controller 100a receives the write data DT from the second interface IF_2a and performs the first data processing using the first ECC engine 112a (④). In this regard, the first ECC engine 112a may generate a codeword by performing first ECC encoding on the write data DT before providing the first-processed write data DT' to the memory device 300a (⑤). Here, the first-processed write data DT' may include codeword bits and/or parity bits resulting from operation of the first ECC engine 112a. The memory device 300a may store the first-processed write data DT' in the memory cell array 310a.

Referring to FIG. 3B, write data DTa is received by the memory system 10a from an external host HT via the fifth interface IF_5a (①-a). The FPGA 200a may then transfer the write data DTa to the second ECC engine 212a (②-a). The second ECC engine 212a may generate a codeword by performing second ECC encoding on the write data DTa and transfer second-processed write data including the generated codeword to the third interface IF_3a (③-a). The FPGA 200a may this provide second ECC-encoded data to the memory controller 100a via the third interface IF_3a (④-a). Here, the second ECC-encoded data may include codeword bits and/or parity bits resulting from operation of the second ECC engine 212a. In one particular example embodiment, the codeword bits included in the second ECC-encoded data may not satisfy conditions of an H-matrix, on which the second ECC encoding is based, and thus, may be referred to as pseudo codeword bits.

The memory controller 100a may transfer the data received via the first interface IF_1a to the first ECC engine 112a (⑤-a). The first ECC engine 112a may generate a codeword by performing the first ECC encoding on the second ECC-encoded data received via the first interface IF_1a, and provide the first-processed write data DTa' including the generated codeword to the memory device 300a (⑥-a). For example, the first-processed write data DTa' may include codeword bits and/or parity bits resulting from operation of the first ECC engine 112a, as well as codeword bits and/or parity bits resulting from operation of the second ECC engine 212a. Here, the resulting combination of codeword bits included in the data DTa' may be perfect codeword bits satisfying conditions of each of an H-matrix, on which the first ECC encoding is based, and the H-matrix, on which the second ECC encoding is based.

Figure 4:
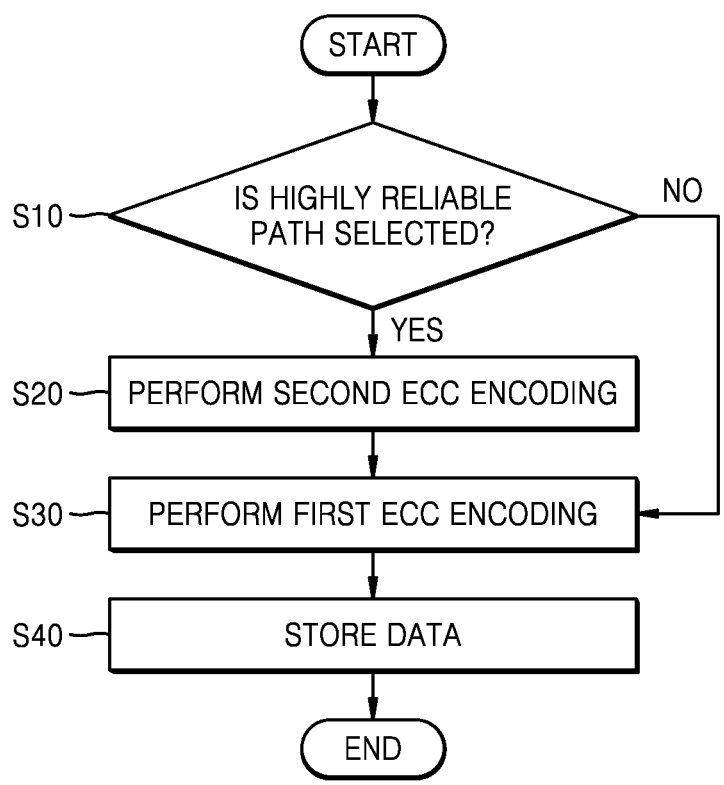
FIG. 4 is a flowchart summarizing a method of operating memory system according to an example embodiment.

FIG. 4 is a flowchart summarizing one method of operating a memory system according to an example embodiment. The following description of the method of FIG. 4 assumes the selective execution of data write operations by the memory system 10a of FIG. 2.

Referring to FIG. 4, the memory system 10a selects between a normal write operation using the normal path and a highly reliable write operation using the highly reliable path (S10). For example, the memory system 10a may select between the normal path and the highly reliable path based on a program input provided to the FPGA 200a, or a related circuit change associated with the FPGA 200a.

When the normal path is selected (S10=N) to perform a normal write operation for externally provided write data, the memory system 10a may perform the first ECC encoding on the write data DT (S30). Thereafter, the resulting first ECC-encoded write data may be written (or programmed) to the memory cell array 310a (S40).

In this regard, the FPGA 200a may transfer the externally-provided write data DT received via the fifth interface IF_5a to the memory controller 100a via the fourth interface IF_4a, and the memory controller 100a may receive the write data DT via the second interface IF_2a. The memory controller 100a may then process the write data DT using the first ECC engine 112a to perform the first ECC encoding on the write data DT received via the second interface IF_2a, and then output the first ECC-encoded data to the memory device 300a.

When the highly reliable path is selected (S10=YES) to perform a highly reliable write operation for the externally-provided write data DT, the memory system 10a may sequentially perform the second ECC encoding on the write data DT (S20) and the first ECC encoding on the write data DT (S30). Thereafter, the resulting second ECC-encoded and first ECC-encoded write data may be written (or programmed) to the memory cell array 310a (S40).

In this regard, the FPGA 200a may allow the second ECC engine 212a to perform the second ECC encoding on the write data DT. The FPGA 200a may output second ECC-encoded data to the memory controller 100a via the third interface IF_3a. Next, the memory system 10a may perform the first ECC encoding on the second ECC-encoded data (S30). Specifically, the memory system 10a may allow the first ECC engine 112a to perform the first ECC encoding on the data received via the first interface IF_1a (or the data obtained by the second ECC encoding). The memory controller 100a may then output the sequentially encoded write data DT' to the memory device 300a.

Figure 5:
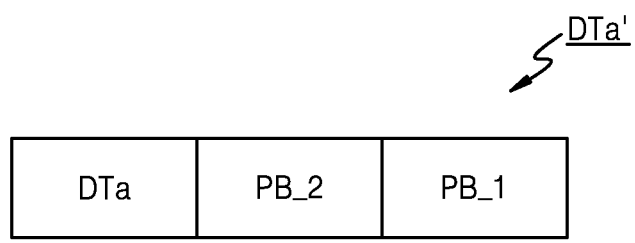
FIG. 5 is a conceptual diagram illustrating one possible configuration for ECC-encoded data according to an example embodiment.

FIG. 5 is a conceptual diagram illustrating one possible configuration for ECC-encoded data according to an example embodiment. Here, the configuration of write data illustrated in FIG. 5 and stored in the memory device 300a may result from the execution of highly reliable write operation like the one described in relation to FIGS. 3B and 4.

Referring to FIG. 5, the write data DTa' may include input data bits DTa, second ECC parity bits PB_2, and first ECC parity bits PB_1. For example, the write data DTa' may be data obtained by sequentially performing the second ECC encoding and the first ECC encoding on write data that is then transferred to the memory device 300a for programming.

For example, the input data bits DTa may be in a codeword form generated by the first and second ECC encoding. The first ECC parity bits PB_1 may be parity bits generated by the first ECC encoding, and the second ECC parity bits PB_2 may be parity bits generated by the second ECC encoding. In an example embodiment, the number of input data bits DTa and the number of second ECC parity bits PB_2 may vary based on a program (PGM in FIG. 1) of a user. For example, as the FPGA 200a is programmed (or has a change in a circuit thereof) toward increasing the data reliability of the memory system 10a, the number of input data bits DTa may be decreased and the number of second ECC parity bits PB_2 may be increased. Alternatively, as the FPGA 200a is programmed (or has a change in a circuit thereof) toward increasing the storage data capacity of the memory system 10a, the number of input data bits DTa may be increased and the number of second ECC parity bits PB_2 may be decreased. In other words, a memory system consistent with one or more of the foregoing embodiments may be used to define a flexible degree of error correction capabilities within a data processing system. Thus, a degree of error correction for stored data may be selectively defined according to (e.g.,) a user preference. And as an additional benefit, the lifespan of the memory system may be improved.

Figure 6A:
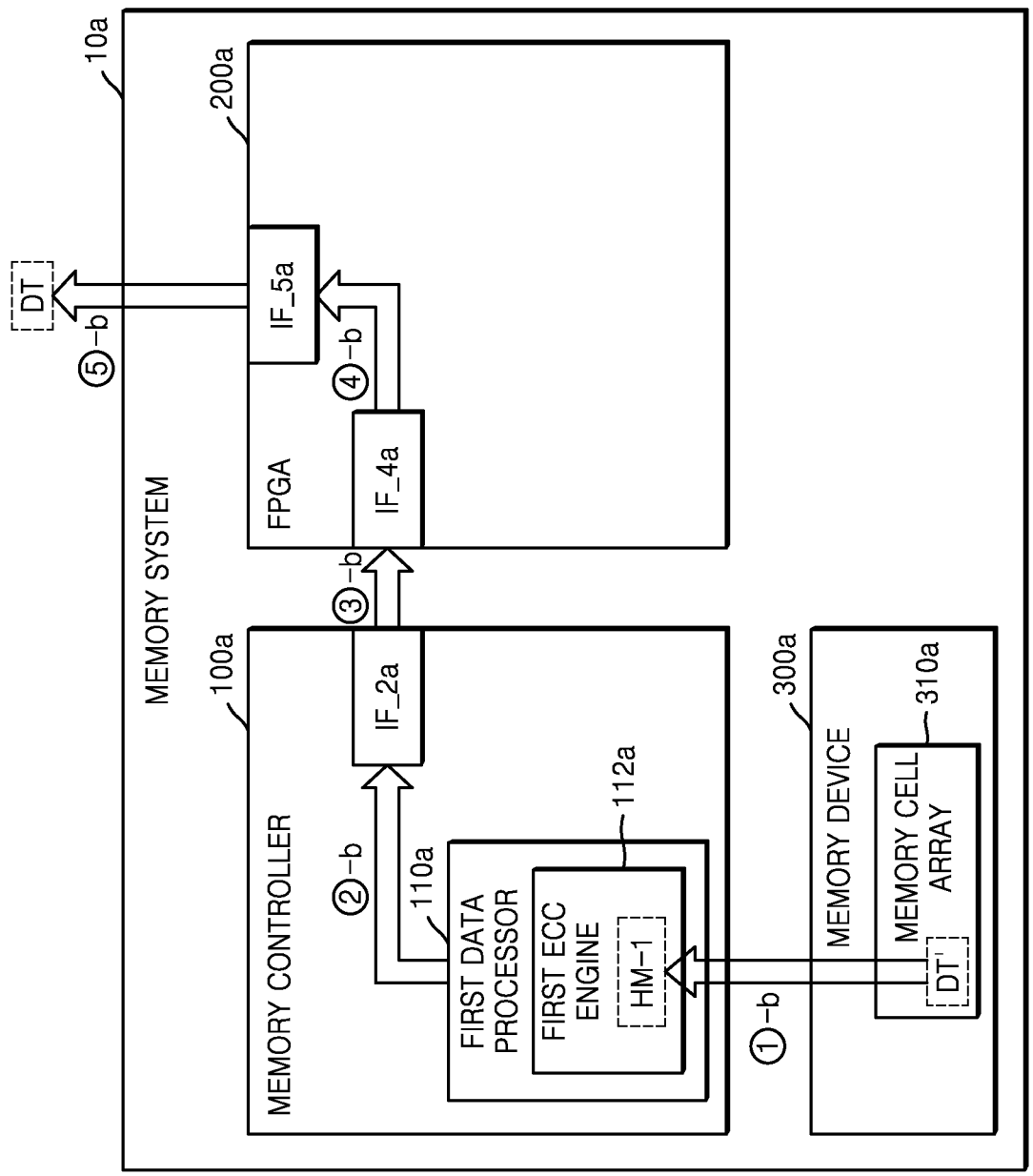
FIGS. 6A and 6B are respective conceptual diagrams illustrating the movement of data in relation to various example embodiments.
Figure 6B:
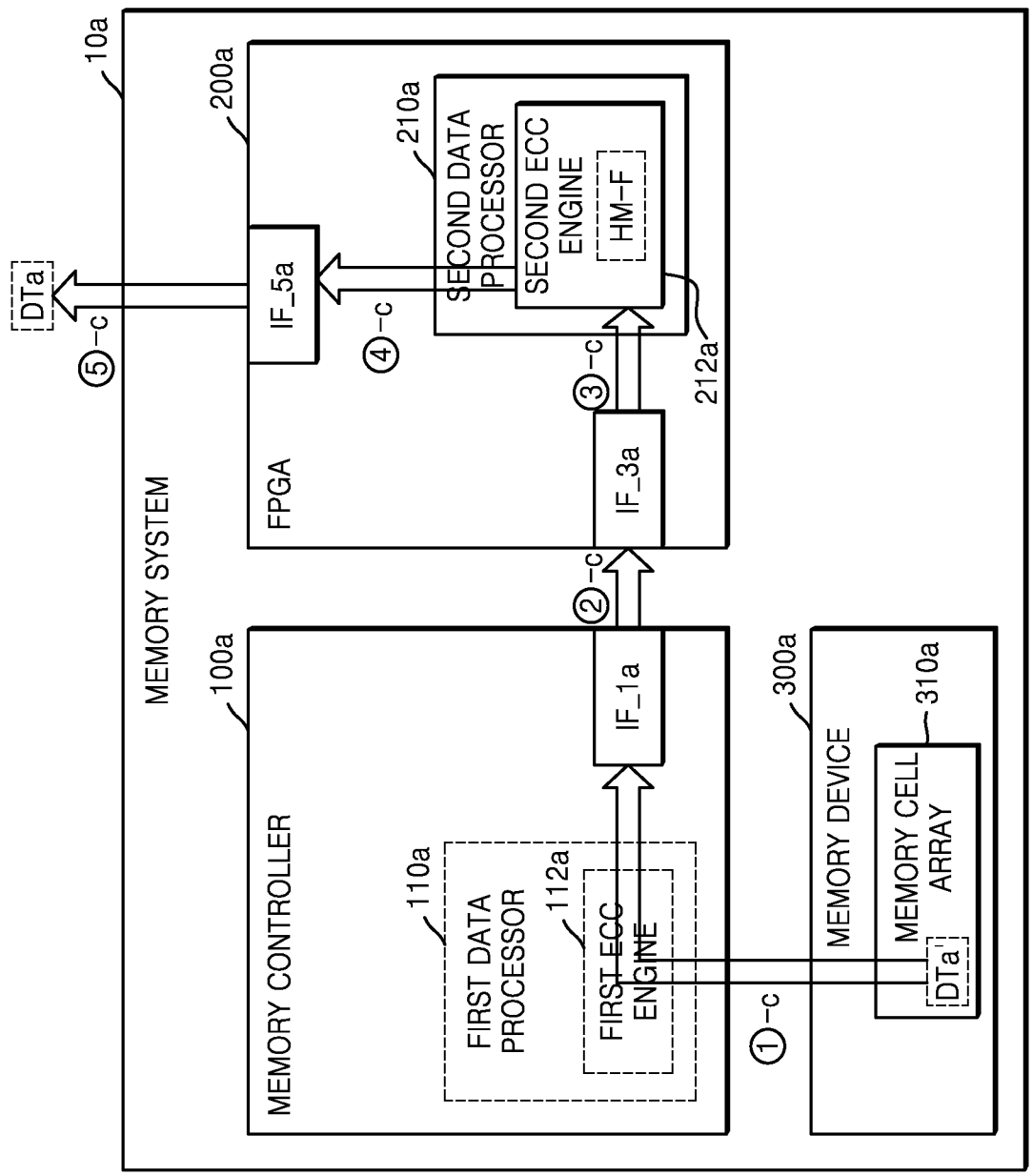

FIGS. 6A and 6B are respective conceptual diagrams illustrating the movement of data according to example embodiments. More particularly, FIG. 6A illustrates the movement of read data via a normal path, and FIG. 6B illustrates the movement of read data via a highly reliable path.

Referring to FIG. 6A, the memory device 300a may output read data DT' retrieved from the memory cell array 310a to the memory controller 100a (①-b). The memory controller 100a may transfer the read data DT' to the first ECC engine 100a, and the first ECC engine 100a may perform first ECC decoding on the read data DT'. For example, the first ECC engine 100a may perform the first ECC decoding on the read data DT' based on a first H-matrix HM-1. Here, for example, the read data DT, as retrieved from the memory device 300a, may include a codeword and first ECC parity bits generated by a previous execution of a first ECC encoding.

The first decoded read data DT obtained by the first ECC decoding may be transferred to the second interface IF_2a (②-b), and the memory controller 100a may output the first decoded read data DT to the FPGA 200a via the second interface IF-2a (③-b). The FPGA 200a may received the first decoded read data DT via the fourth interface IF-4a and transfer the first decoded read data DT to the fifth interface IF_5a (④-b). The FPGA 200a may output the first decoded read data DT via the fifth interface IF_5a from the memory system 10a and the host HT (⑤-b).

Alternately, referring to FIG. 6B, the memory device 300a may output the read data DTa' retrieved from the memory device 300a to the memory controller 100a (①-c). In an example embodiment, the read data DTa' may include first ECC parity bits and second ECC parity bits. In addition, the read data DTa' may include a codeword generated by the first ECC encoding and the second ECC encoding.

In one example embodiment, the first data processor 110a may effectively bypass the first ECC engine 112a by transferring the read data DTa' retrieved from the memory device 300a to the first interface IF_1a. In other words, the memory system 10a in selecting the highly reliable path may bypass the first ECC engine 112a during execution of a highly reliable data read operation, such that the FPGA 200a performs ECC decoding of the read data DTa' obtained by the first and second ECC encoding. Hence, the memory controller 100a may directly transfer the read data DTa' from the memory device 300a to the FPGA 200a via the first interface IF_1a (②-c).

The FPGA 200a may then transfer the read data DTa' received via the third interface IF_3a to the second ECC engine 212a (③-c). The second ECC engine 212a may perform ECC decoding on the read data DTa' based on an FPGA H-matrix HM-F. In an example embodiment, the FPGA H-matrix HM-F may include the first H-matrix HM-1 for first ECC decoding and a second H-matrix for second ECC decoding. A further description of these components will be made hereafter in some additional detail with reference to FIG. 8.

The FPGA 200a may transfer the second decoded read data DTa obtained by performing the second ECC decoding using the second ECC engine 212a to the fifth interface IF_5a (④-c). The FPGA 200a may then provide the second decoded data DTa to an external host HT via the fifth interface IF_5a (⑤-c).

Figure 7:
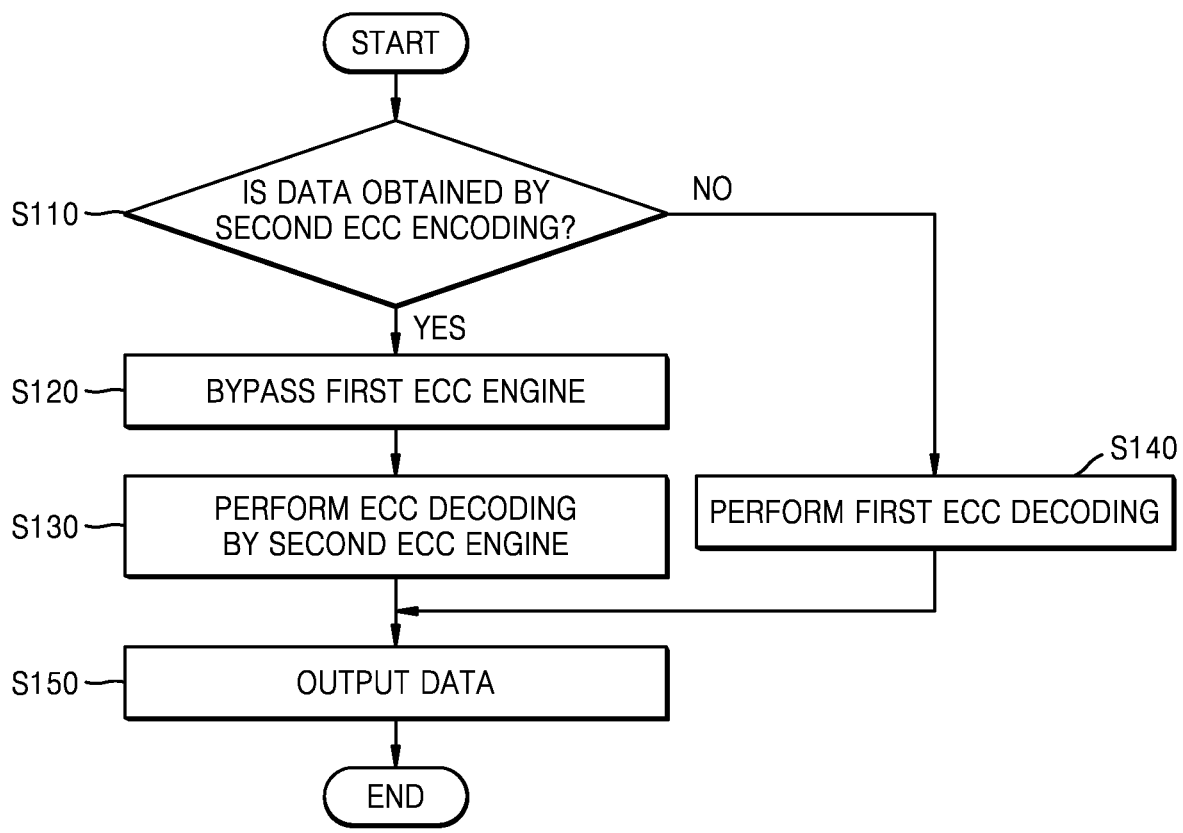
FIG. 7 is a flowchart summarizing a method of operating a memory system according to an example embodiment.

FIG. 7 is a flowchart summarizing a method of operating a memory system according to an example embodiment. Here, the method of FIG. 7 assumes a selective execution of read operations by the memory system 10a of FIG. 2.

Referring to FIG. 7, in response to a read requested received from (e.g.,) a host HT, the memory system 10a determines whether or not the read data identified by the read request may be obtained by performing the second ECC encoding using the FPGA 200a (S110). In other words, the memory system 10a selects data read path according to whether the identified read data was previously written to the memory cell array 310a using a normal write path or a highly reliable write path.

For example, when the requested read data is data written according to the normal write path and therefore obtained by performing only the first ECC encoding (S110=NO), the memory system 10a allows the first ECC engine 112a included in the memory controller 100a to perform the first ECC decoding on the read data DT' (S140). Thereafter, the first decoded read data DT obtained by the first ECC decoding may be output to the requesting host HT by the memory system 10a via the second interface IF_2a, the fourth interface IF_4a, and the fifth interface IF_5a (S150).

However, when the requested read data is the data obtained by performing the second ECC encoding (S110=YES), the memory system 10a bypasses the first ECC engine 112a (S120) to directly transfer the read data DT' to the second ECC engine 212a of the FPGA 200a via the first interface IF_1a.

The FPGA 200a receiving the read data DT' via the third interface IF_3a may transfer the read data DT' to the second ECC engine 212a, and the second ECC engine 212a may perform the second ECC decoding on the read data DT' (S130) to provide second decoded read data DT.

For example, the second ECC engine 212a may perform the second ECC decoding on the read data DT' based on the FPGA H-matrix HM-F including the first H-matrix HM-1 for first ECC decoding and a second H-matrix for second ECC decoding. The FPGA 200a may output the second decoded read data DT obtained by performing the second ECC decoding using the second ECC engine 212a to the host HT via the fifth interface IF_5a (S150).

Figure 8:
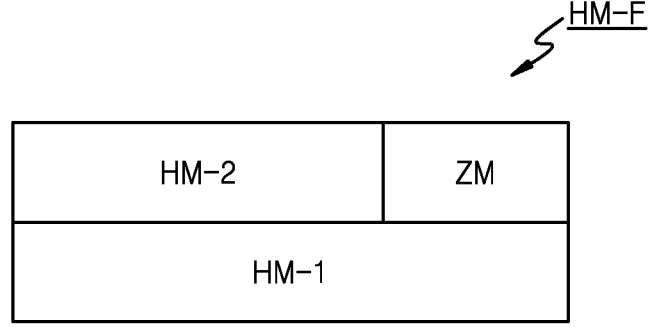
FIG. 8 is a conceptual diagram illustrating one possible configuration for the FPGA H-matrix of FIG. 6B.

FIG. 8 is a conceptual diagram illustrating in one example the FPGA H-matrix of FIG. 6B.

Referring to FIG. 8, the FPGA H-matrix HM-F may include the first H-matrix HM-1, a second H-matrix HM-2, and a zero-matrix ZM. In an example embodiment, the first H-matrix HM-1 may be used for a first ECC encoding/decoding operation of the first ECC engine 112a. In addition, the second H-matrix HM-2 may be used for a second ECC encoding/decoding operation of the second ECC engine 212a. Further, the zero-matrix ZM may be a matrix in which every element equals 0.

The second ECC engine 212a includes the FPGA H-matrix HM-F, whereby the second ECC engine 212a may perform an ECC decoding operation on the data obtained by the first and second ECC encoding. In other words, in data writing along the high reliable path, the memory system 10a may allow the second ECC engine 212a and the first ECC engine to respectively perform ECC encoding in this stated order, and in data reading along the high reliable path, the memory system 10a may allow the second ECC engine 212a to perform ECC decoding all at once.

Figure 9:
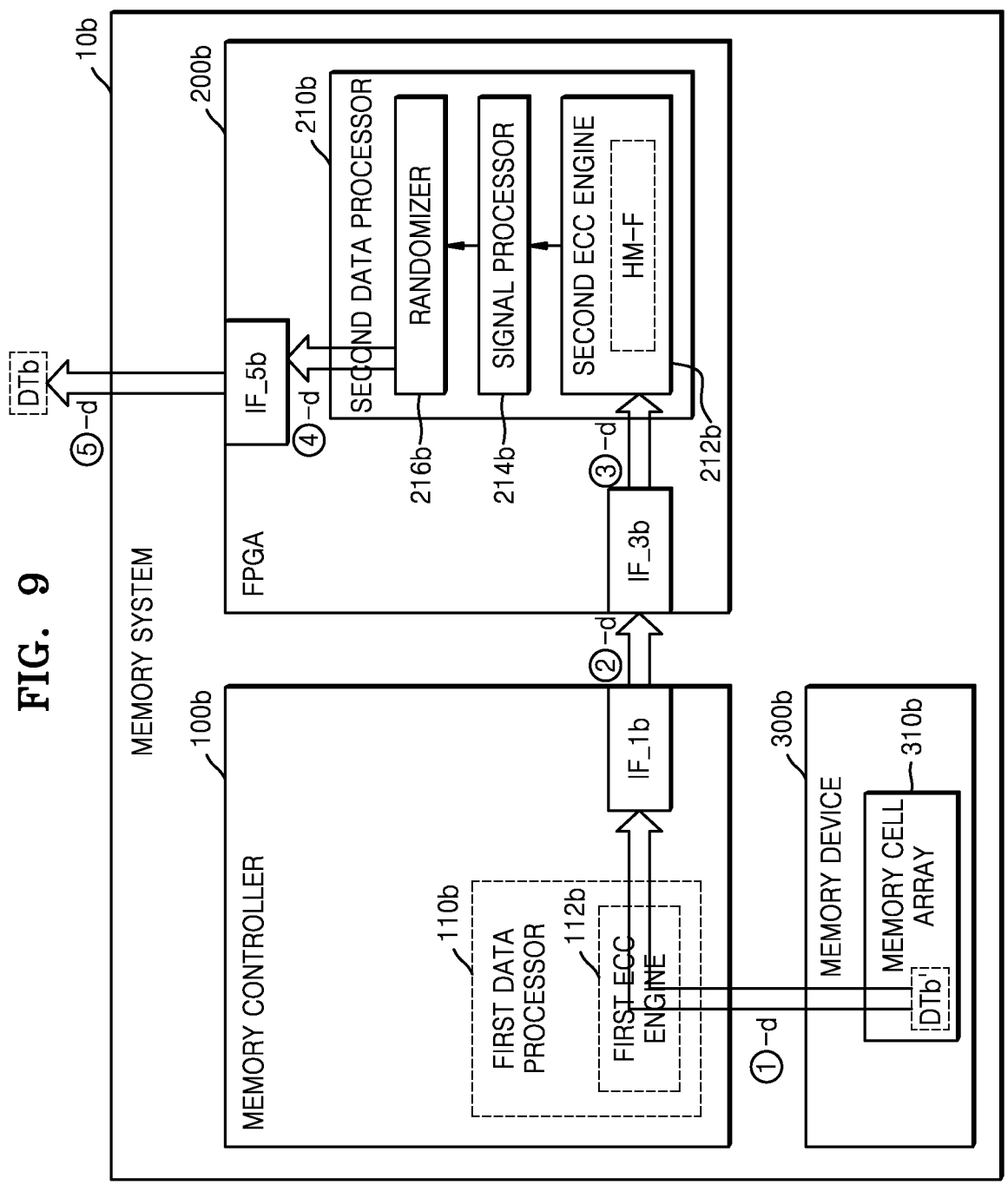
FIGS. 9 and 10 are respective block diagrams illustrating memory system(s) and a related data read operation(s) according to certain example embodiments.

FIG. 9 is a block diagram illustrating a memory system and a highly reliable data read operation according to an example embodiment.

Referring to FIG. 9, a memory device 300b may output read data DTb' retrieved from a memory cell array 310b to a memory controller 100b. The memory controller 100b may then transfer the read data DTb' via a first interface IF_1b by essentially bypassing the first ECC engine 112b (①-d). That is, the memory controller 100b may directly transfer the read data DTb' to an FPGA 200b via the first interface IF_1b (②-d).

The FPGA 200b may then transfer the read data DTb' received via a third interface IF_3b to a second data processor 210b (③-d). In an example embodiment, the second data processor 210b may include a signal processor 214b and a randomizer 216b in addition to a second ECC engine 212b. Upon receiving the read data DTb', the second data processor 210b may allow the second ECC engine 212b, the signal processor 214b, and the randomizer 216b to respectively and sequentially perform operations on the read data DTb'. For example, the second ECC engine 212b may perform a second ECC decoding operation on the read data DTb' based on the FPGA H-matrix HM-F, and the signal processor 214b may perform various kinds of signal processing for various calculations of ECC-decoded data. In addition, the randomizer 216b may perform a de-randomization operation on signal-processed data and transfer the resulting "randomness-removed read data" to an external host HT via a fifth interface IF_5b (④-d).

Figure 10:
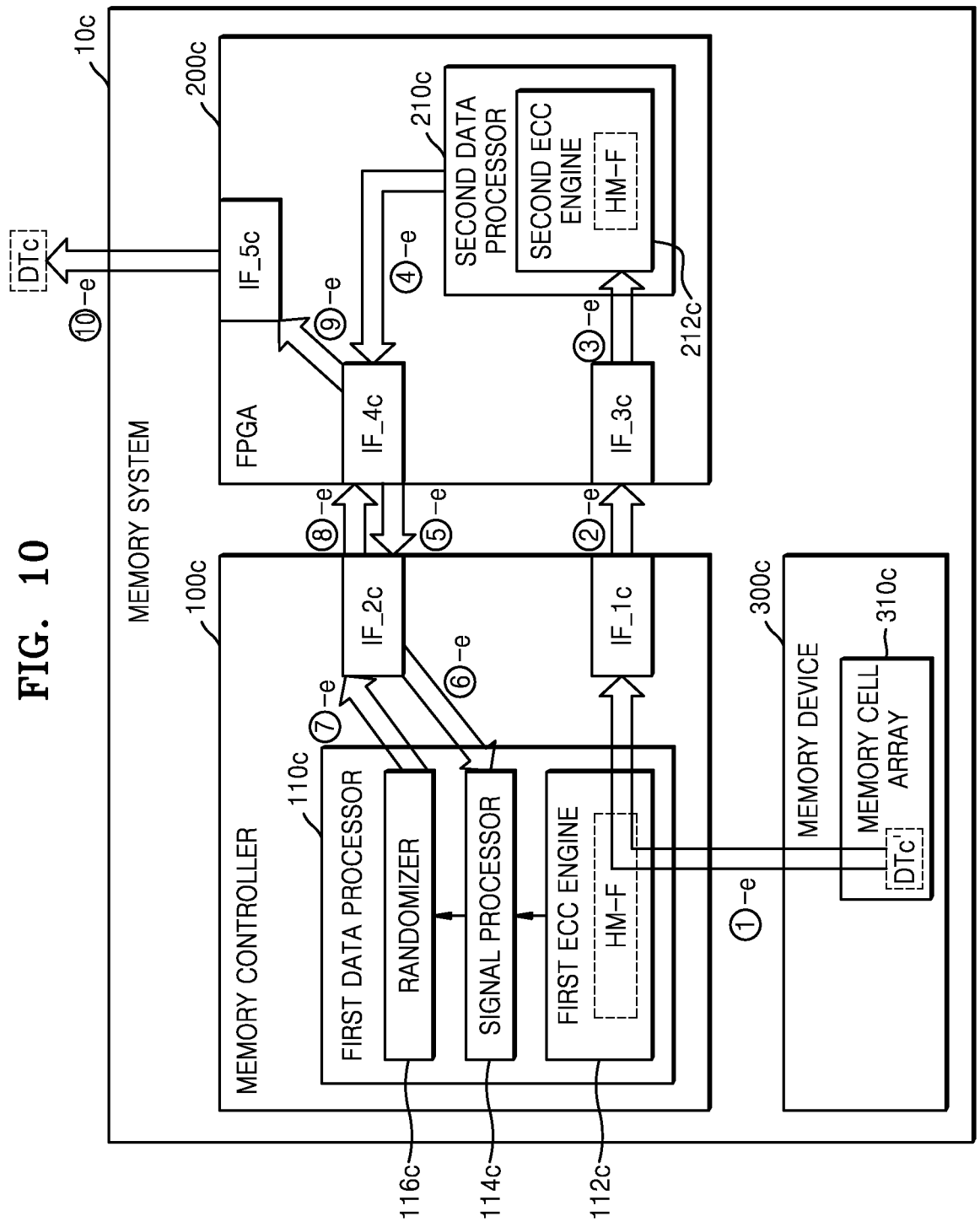

FIG. 10 is a block diagram illustrating a memory system and a highly reliable data read operation according to another example embodiment.

Referring to FIG. 10, a memory device 300c may output read data DTc' retrieved from a memory device 300c to a memory controller 100c. The memory controller 100c may then transfer the read data DTc' to a first interface IF_1c by bypassing a first ECC engine 112c (①-e). Hence, the memory controller 100c may directly transfer the read data DTc' to an FPGA 200c via the first interface IF_1c (②-e).

The FPGA 200c may transfer the red data DTc' received via a third interface IF_3c to a second ECC engine 212c (③-e), and the second ECC engine 212c may perform a second ECC decoding on the read data DTc' based on the FPGA H-matrix HM-F. The FPGA 200c may transfer the resulting second-decoded read data to a fourth interface IF_4c (④-e) and output the second-decoded read data to the memory controller 100c (⑤-e).

The memory controller 100c may transfer the second-decoded read data received via a second interface IF_2c to a first data processor 110c (⑥-e). In an example embodiment, the first data processor 110c may further include a signal processor 114c and a randomizer 116c in addition to a first ECC engine 112c. The first data processor 110c receiving the second-decoded read data may allow the signal processor 114c and the randomizer 116c to respectively and sequentially perform operations on the second-decoded read data, and may transfer the resulting read data DTc obtained by signal processing and de-randomization to the second interface IF_2c (⑦-e). The memory controller 100c may output the randomness-removed read data DTc to the FPGA 200c via the second interface IF_2c (⑧-e). The FPGA 200c may transfer the randomness-removed read data DTc received via the fourth interface IF_4c to a fifth interface IF_5c (⑨-e) and output the randomness-removed read data DTc to an external host HT via the fifth interface IF_5c (⑩-e).

Figure 11:
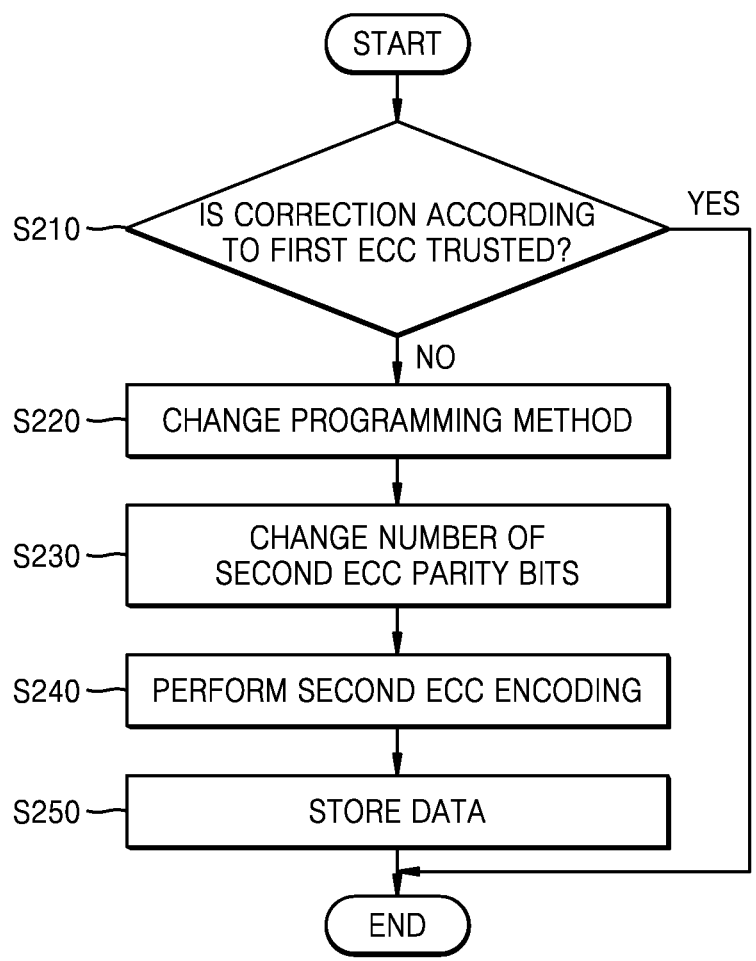
FIG. 11 is a flowchart summarizing one possible approach to the operation of a memory system according to an example embodiment.

FIG. 11 is a flowchart summarizing a method of operating a memory system according to another example embodiment, and should be considered together with the block diagram of FIG. 2.

Referring to FIG. 11, the memory system 10a may determine whether a first error correction performed by the first ECC engine 112a of the memory controller 100a is trusted (S210). For example, a determination of whether or not a first ECC error correction is trusted may be made on the basis of information (e.g.) regarding a number of times that the memory device 300a has performed certain operations (e.g., program operations and/or erase operations), or other information provided by the host HT.

When the first error correction is determined to not be trusted (S210=NO), the memory controller 100a may change a data programming method (S220). In an example embodiment, the memory controller 100a may change a data programming method by which n-bit data (where 'n' is a positive integer greater than 1) is stored in each memory cell of the memory cell array 310a to a data programming method by which (n−1)-bit data is stored in each memory cell. For example, the memory controller 100a may change a data programming method according to a QLC method to that according to a TLC method, or may change a data programming method according to an MLC method to that according to an SLC method. Therefore, the memory controller 100a may select a relatively more reliable data programming method, and thus, the lifespan of the memory system 10a may be extended.

Next, the FPGA 200a may change a number of second ECC parity bits generated by second ECC encoding of the second ECC engine 212a (S230). As the capacity of stored data is reduced due to a change in a programming method in the process of S220, the FPGA 200a may reduce the number of second ECC parity bits generated by the second ECC encoding. The FPGA 200a may perform the second ECC encoding on data based on the changed number of second ECC parity bits (S240). For example, data having undergone the second ECC encoding may further undergo first ECC encoding by the first ECC engine 112a included in the memory controller 100a and then be output to the memory device 300a, and the memory device 300a may store received data in the memory cell array 310a (S250).

Figure 12:
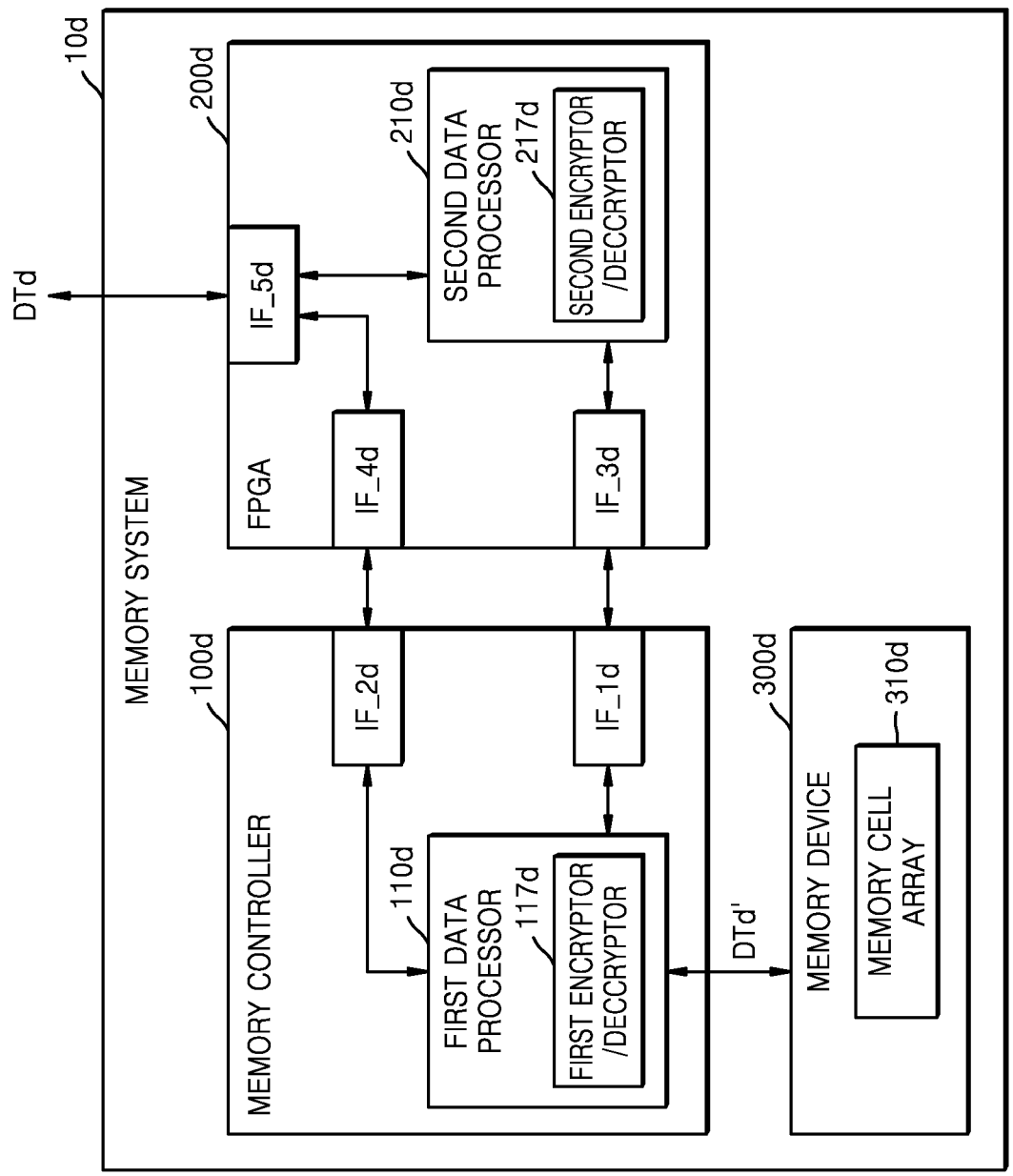
FIGS. 12, 13, 14, 15, 16 and 17 are respective block diagrams variously illustrating memory systems according to example embodiments.

FIG. 12 is a block diagram illustrating a memory system according to another example embodiment.

Referring to FIG. 12, a first data processor 110d may include a first encryptor/decryptor 117d. In addition, a second data processor 210d may include a second encryptor/decryptor 217d. In an example embodiment, the first encryptor/decryptor 117d may perform a first encryption operation on data received from one of a first interface IF_1d and a second interface IF_2d and perform a first decryption operation on data DTd' read from the memory device 300d. In addition, in an example embodiment, the second encryptor/decryptor 217d may perform a second encryption operation on data DTd received via a fifth interface IF_5d and perform a second decryption operation on data received via a third interface IF_3d. For example, each of the first encryptor/decryptor 117d and the second encryptor/decryptor 217d may perform encryption and decryption operations based on various algorithms such as Message-Digest algorithm (MD5), Secure Hash Algorithm (SHA), Rivest-Shamir-Adleman (RSA), Advanced Encryption Standard (AES), and Data Encryption Standard (DES).

In an example embodiment, a memory system 10d may sequentially perform the second encryption operation and the first encryption operation, in this stated order, on the data DTd received from outside thereof and thus store sequentially encrypted data in a memory cell array 310d. For example, the second encryptor/decryptor 217d may perform the second encryption operation on the data DTd received via the fifth interface IF_5d and thus output second encrypted data to a memory controller 100d via the third interface IF_3d. The memory controller 100d may receive the second encrypted data via the first interface IF_1d and may allow the first encryptor/decryptor 117d to perform the first encryption operation thereon.

In an example embodiment, the data DTd' read from the memory cell array 310d may undergo the first decryption operation by the first encryptor/decryptor 117d and then undergo the second decryption operation by the second encryptor/decryptor 217d. In another example embodiment, the memory controller 100d may output the data DTd' read from the memory cell array 310d to an FPGA 200d by causing the first encryptor/decryptor 117d to bypass the data DTd', and the second encryptor/decryptor 217d may perform the first and second decryption operations on the data DTd' all at once.

Figure 13:
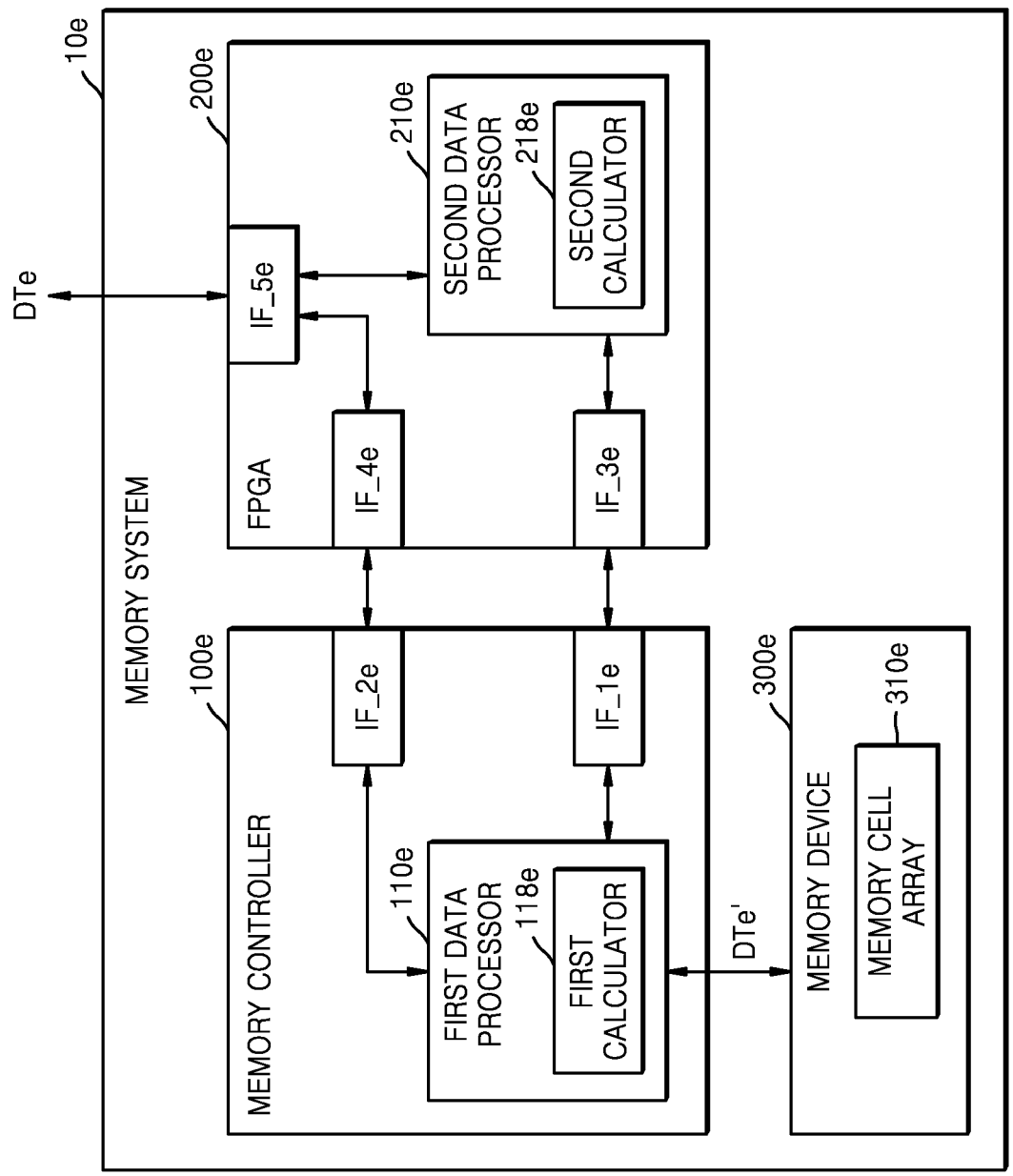

FIG. 13 is a block diagram illustrating a memory system according to another example embodiment.

Referring to FIG. 13, a first data processor 110e may include a first calculator 118e. In addition, a second data processor 210e may include a second calculator 218e. In an example embodiment, the first calculator 118e may perform a first calculation operation on data received from one of a first interface IF_1e and a second interface IF_2e or data DTe' read from a memory device 300e. In addition, in an example embodiment, the second calculator 218e may perform a second calculation operation on data DTe received via a fifth interface IF_5e or data received via a third interface IF_3e.

The first calculator 118e may perform the first calculation operation having first complexity, and the second calculator 218e may perform the second calculation operation having second complexity. In an example embodiment, the second complexity of the second calculation operation may be higher than the first complexity of the first calculation operation. For example, the first calculator 118e may support the four fundamental arithmetic operations, such as addition, subtraction, multiplication, and division, for data. In addition, the second calculator 218e may support various calculations, such as exponential functions and sin/cos functions, for data.

As an example, when a calculation having low complexity is required in data reading, the data DTe' read from a memory cell array 310e may undergo the first calculation operation by the first calculator 118e and then be output to the outside of a memory system 10e via the second interface IF_2e, a fourth interface IF_4e, and the fifth interface IF_5e. As another example, when a calculation having high complexity is required in data reading, the data DTe' read from the memory cell array 310e may undergo the first calculation operation by the first calculator 118e and then be output to an FPGA 200e via the first interface IF_1e. The FPGA 200e may allow the second calculator 218e to perform the second calculation operation on data received via the third interface IF_3e and may output second calculated data to the outside of the memory system 10e via the fifth interface IF_5e. Thus, the data transmitted/received between the first interface IF_1e and the third interface IF_3e may have a different format from the data transmitted/received between the second interface IF_2e and the fourth interface IF_4e.

Figure 14:
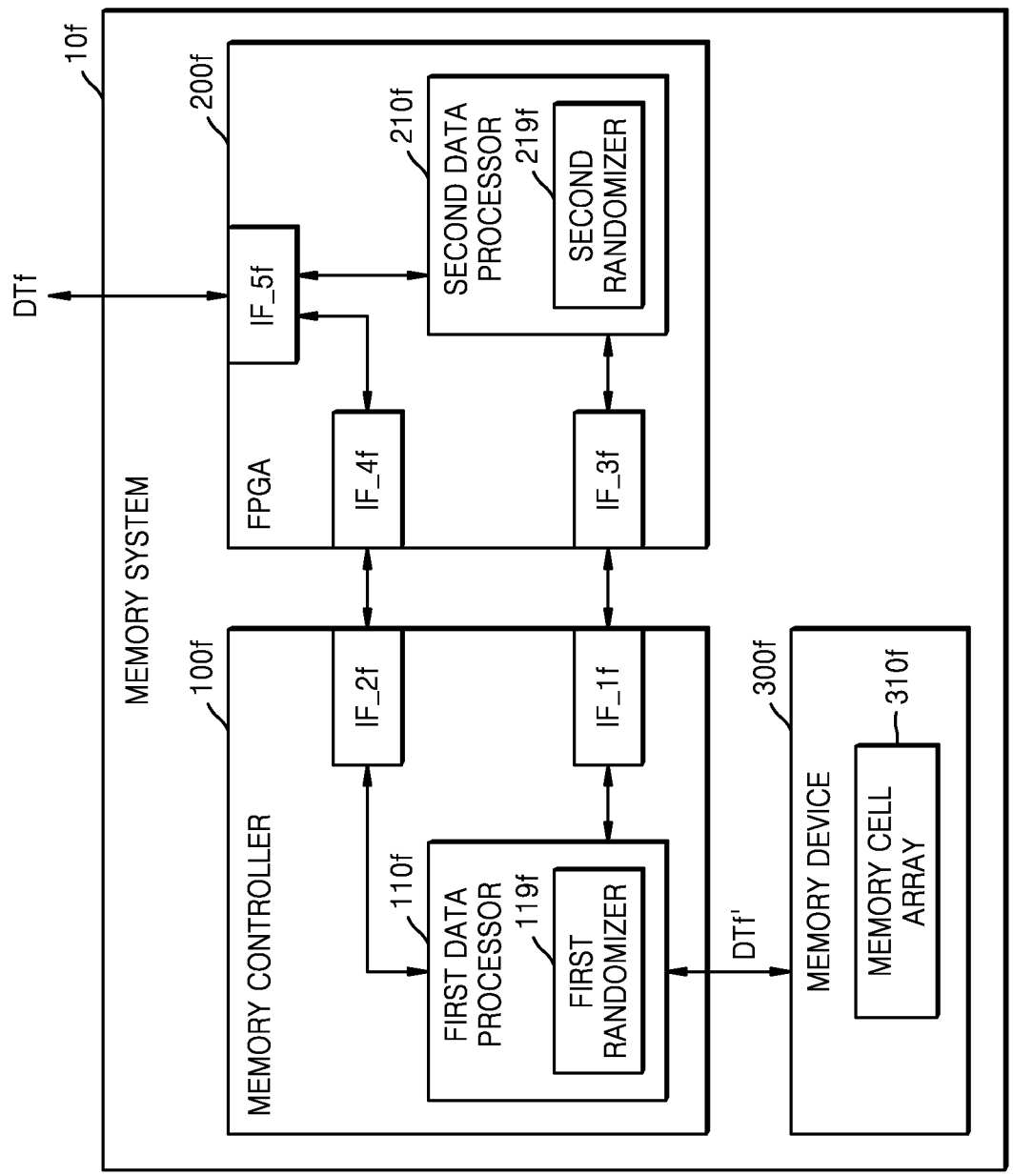

FIG. 14 is a block diagram illustrating a memory system according to another example embodiment.

Referring to FIG. 14, a first data processor 110f may include a first randomizer 119f. In addition, a second data processor 210f may include a second randomizer 219f. In an example embodiment, the first randomizer 119f may perform a first randomization operation on data received from one of a first interface IF_1f and a second interface IF_2f and perform a first de-randomization operation on data DTf' read from a memory device 300f. In addition, in an example embodiment, the second randomizer 219f may perform a second randomization operation on data DTf received via a fifth interface IF_5f and perform a second de-randomization operation on data received via a third interface IF_3f. For example, randomness may be added to data by the first and second randomization operations, and the added randomness may be removed from the data by the first and second de-randomization operations.

In an example embodiment, a memory system 10f may sequentially perform the second randomization operation and the first randomization operation on the data DTf received from outside thereof in this stated order and thus store sequentially randomized data in a memory cell array 310f. For example, the second randomizer 219f may perform the second randomization operation on the data DTf received via the fifth interface IF_5f and thus output second randomized data to a memory controller 100f via the third interface IF_3f. The memory controller 100f may receive the second randomized data via the first interface IF_1f and perform the first randomization operation thereon.

In an example embodiment, the data DTf' read from the memory cell array 310f may undergo the first de-randomization operation by the first randomizer 119f and then undergo the second de-randomization operation by the second randomizer 219f. In another example embodiment, the memory controller 100f may output the data DTf' read from the memory cell array 310f to an FPGA 200f by causing the first randomizer 119f to bypass the data DTf', and the second randomizer 219f may perform the first and second de-randomization operations on the data DTf' all at once.

Figure 15:
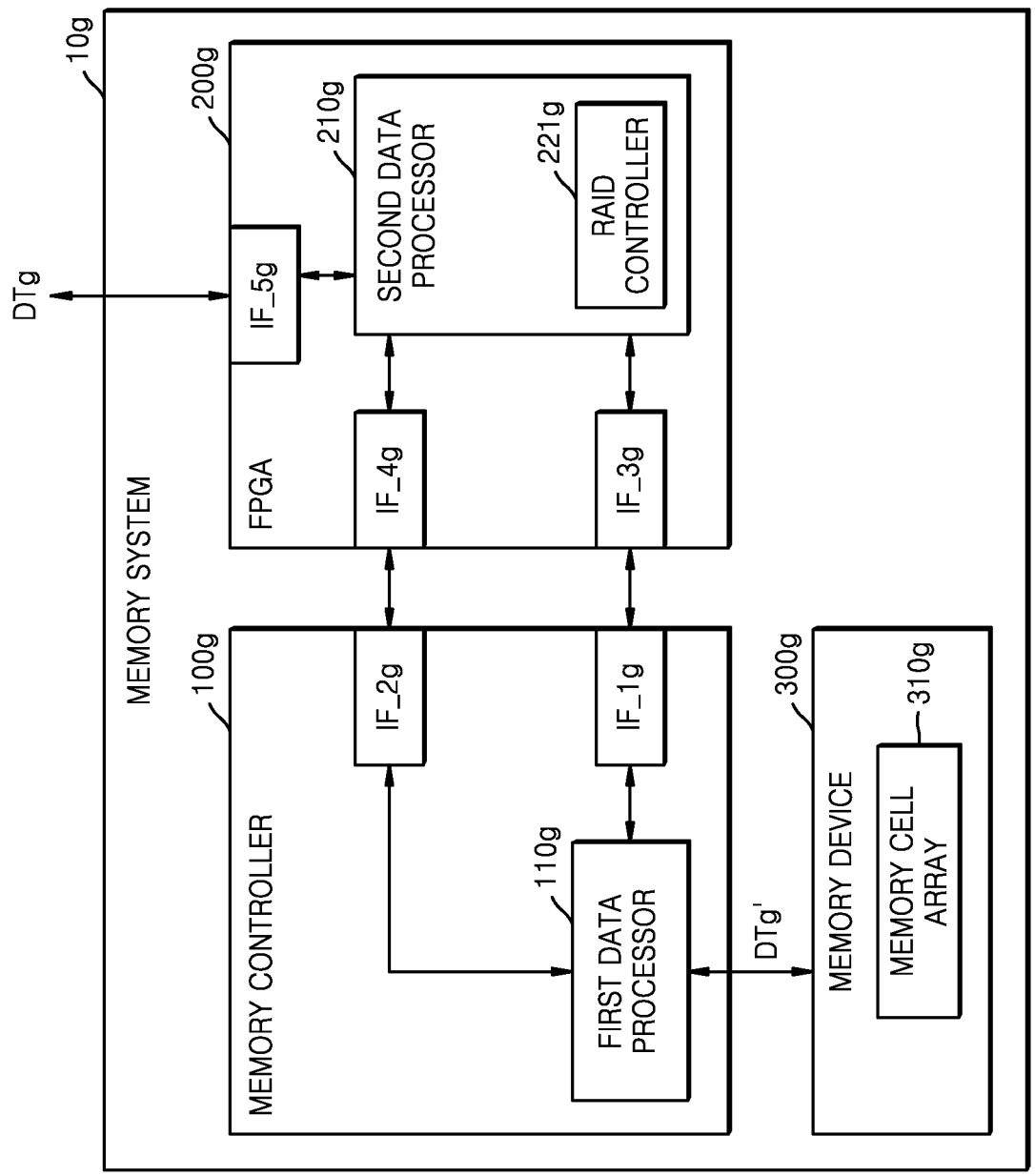

FIG. 15 is a block diagram illustrating a memory system according to another example embodiment.

Referring to FIG. 15, a second data processor 210g may include a Redundant Array of Independent Disks (RAID) controller 221g. For example, a memory device 300g may store parities together with data according to a RAID method, and when a physical error occurs in the memory device 300g, for example, a memory cell array 310g or the like, the RAID controller 221g may recover damaged data by using parity data.

In an example embodiment, when a physical error occurs in the memory device 300g, a memory controller 100g may bypass read data DTg' and output the read data DTg' to an FPGA 200g via a first interface IF_1g. The FPGA 200g may transfer the read data DTg' input thereto via a third interface IF_3g to the RAID controller 221g, and the RAID controller 221g may recover the damaged read data DTg' based on RAID parity data. Although the RAID controller 221g is described in the present embodiment as being operated based on a parity-based RAID method, it will be understood that the RAID controller 221g may be operated based on a mirroring-based RAID method in another embodiment.

Figure 16:
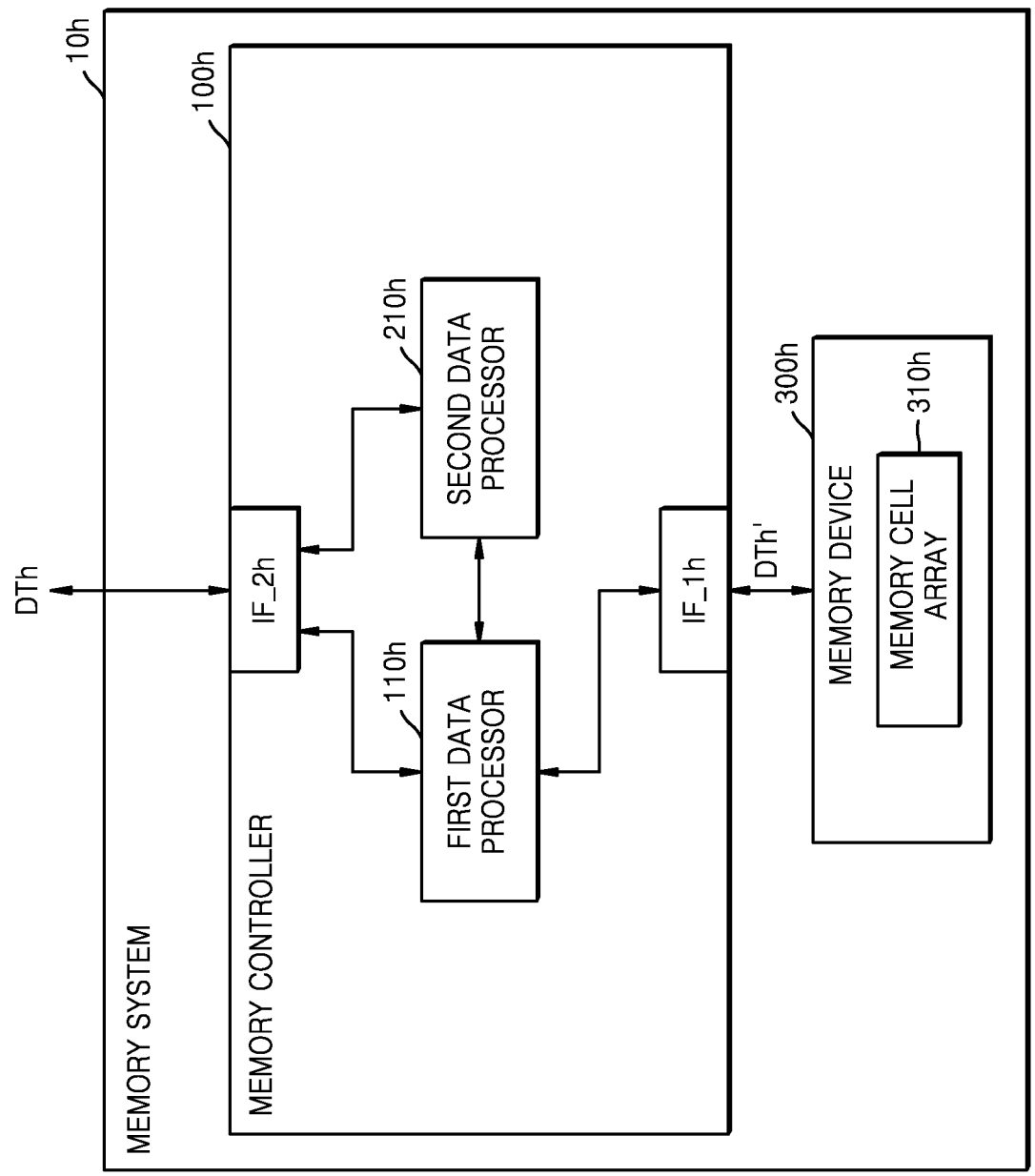

FIG. 16 is a block diagram illustrating a memory system according to another example embodiment.

Referring to FIG. 16, a memory system 10h may include a memory controller 100h and a memory device 300h, and the memory controller 100h may include a first data processor 110h, a second data processor 210h, a first interface IF_1h, and a second interface IF_2h. In other words, as compared with the embodiments described above, the memory controller 100h in the memory system 10h may include both the first data processor 110h and the second data processor 210h. Thus, for example, in a normal path, data DTh for writing may be transferred to the memory device 300h via the second interface IF_2h, the first data processor 110h, and the first interface IF_1h. In addition, in a highly reliable path, the data DTh for writing may be transferred to the memory device 300h via the second interface IF_2h, the second data processor 210h, the first data processor 110h, and the first interface IF_1h.

Figure 17:
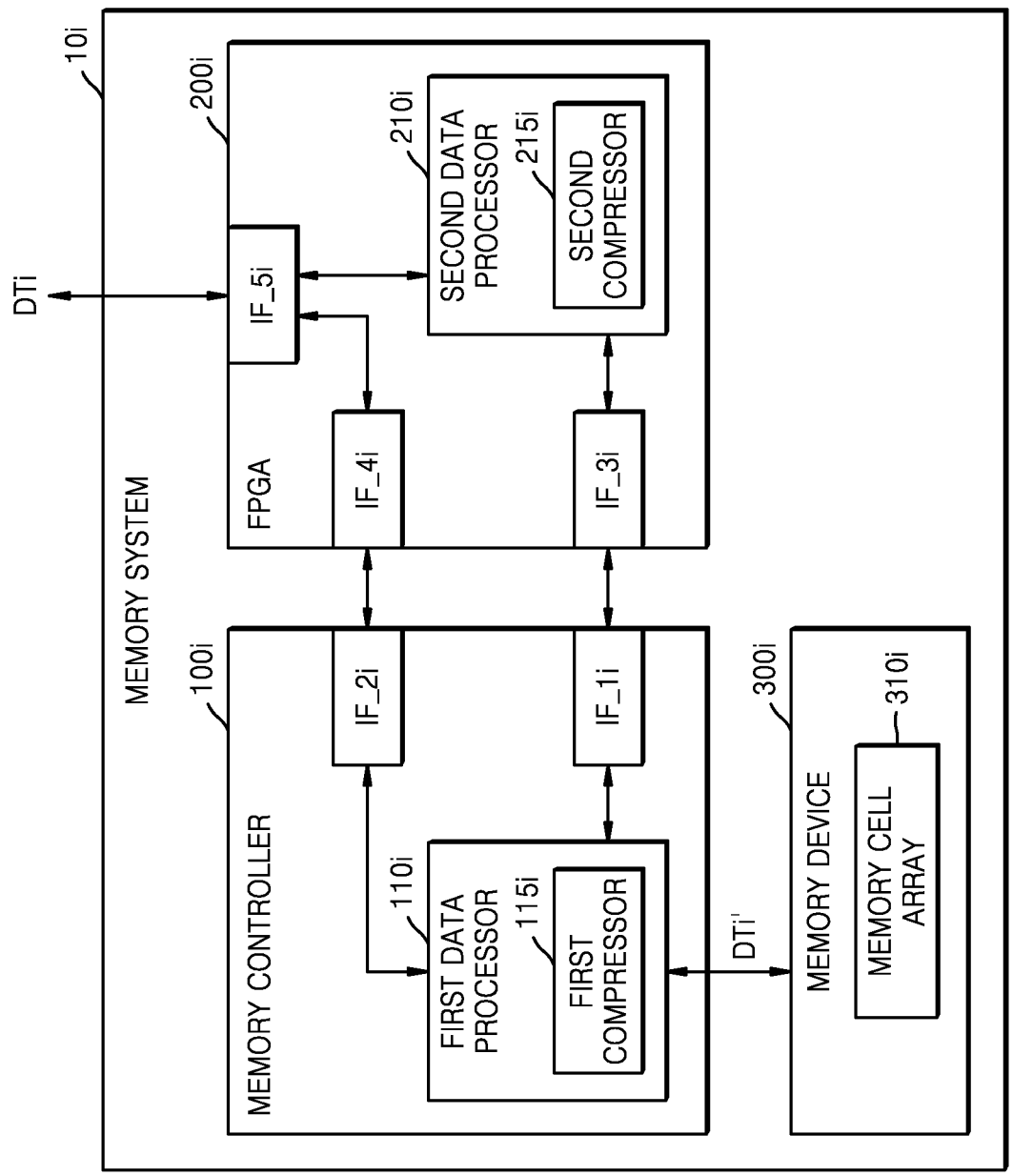

FIG. 17 is a block diagram illustrating a memory system according to another example embodiment.

Referring to FIG. 17, a first data processor 110i may include a first compressor 115i. In addition, a second data processor 210i may include a second compressor 215i. In an example embodiment, the first compressor 115i may perform a first compression operation on data received from one of a first interface IF_1i and a second interface IF_2i and perform a first decompression operation on data DTi' read from a memory device 300i. In addition, in an example embodiment, the second compressor 215i may perform a second compression operation on data DTi received via a fifth interface IF_5i and perform a second decompression operation on data received via a third interface IF_3i.

In an example embodiment, a memory system 10i may sequentially perform the second compression operation and the first compression operation, in this stated order, on the data DTi received from outside thereof and thus store sequentially compressed data in a memory cell array 310i. For example, the second compressor 215i may perform the second compression operation on the data DTi received via the fifth interface IF_5i and thus output second compressed data to a memory controller 100i via the third interface IF_3i. The memory controller 100i may receive the second compressed data via the first interface IF_1i, and the first compressor 115i may perform the first compression operation thereon.

In an example embodiment, the data DTi' read from the memory cell array 310i may undergo the first decompression operation by the first compressor 115i and then undergo the second decompression operation by the second compressor 215i. In another example embodiment, the memory controller 100i may output the data DTi' read from the memory cell array 310i to an FPGA 200i by causing the first compressor 115i to bypass the data DTi', and the second compressor 215i may perform the first and second decompression operations on the data DTi' all at once.

Figure 18:
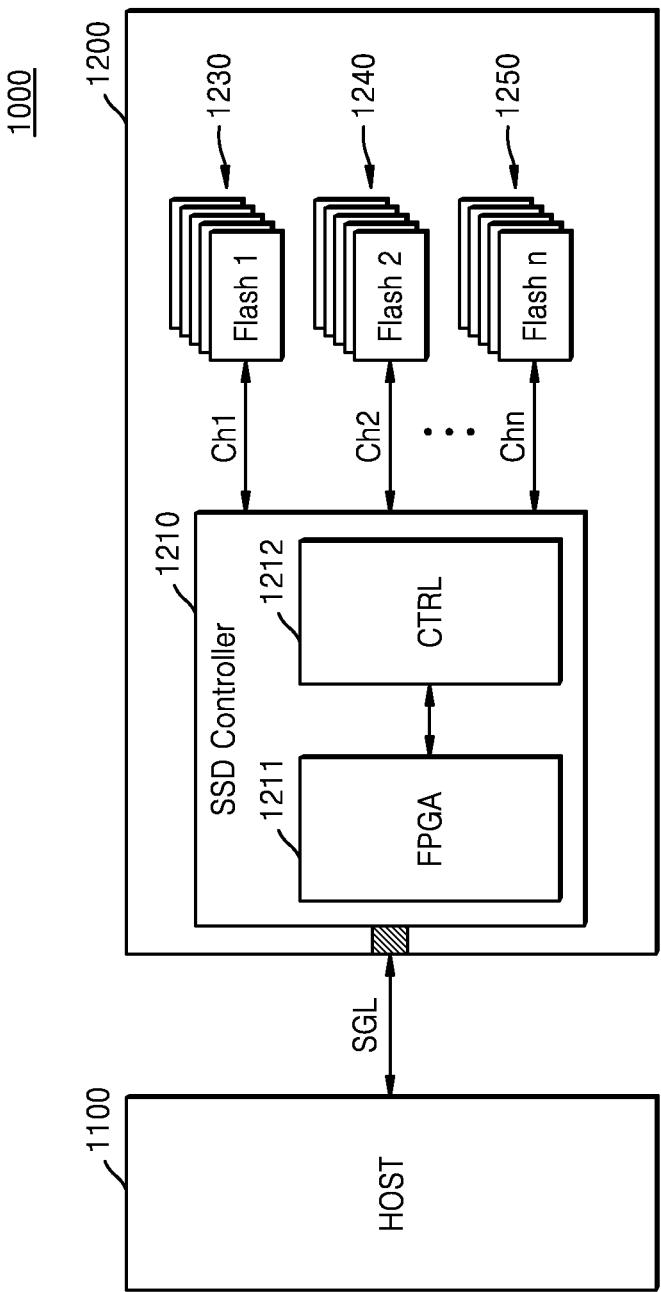
FIG. 18 is a block diagram illustrating a memory system according to example embodiments applied to an SSD system.

FIG. 18 is a block diagram illustrating an example in which a memory system according to example embodiments is applied to an SSD system.

Referring to FIG. 18, an SSD system 1000 may include a host 1100 and an SSD 1200. The SSD 1200 may exchange signals with the host 1100 via a signal connector and may receive power via a power connector. The SSD 1200 may include an SSD controller 1210 and a plurality of memory devices 1230, 1240, and 1250. Here, the SSD controller 1210 may include an FPGA 1211 and a memory controller 1212. According to an example embodiment, the memory controller 1212 and the FPGA 1211 may respectively include the first and second data processors shown in FIGS. 1 to 17. Thus, the SSD system 1000 may support autonomy in the degree of error correction capability or in a data writing/reading method. Therefore, for example, an error correction capability for data may be improved based on a preference of a user, and the lifespan of the SSD system 1000 may be extended.

A memory system according to an example embodiment may be mounted or applied to a memory card system, a computing system, UFS, and the like as well as the SSD system 1000. In addition, the memory system according to an example embodiment may be applied to various electronic systems in which non-volatile memory is mounted.

While the inventive concept has been particularly shown and described with reference to embodiments thereof, it will be understood by those skilled in the art that various changes in form and details may be made therein without departing from the spirit and scope of the following claims. In addition, it should be understood that particular terms used herein are only for the purpose of describing the embodiments and are not intended to limit the inventive concept. Therefore, the scope of the inventive concept should be defined by the accompanying claims and equivalents thereof.

What is claimed is:

1. A memory system comprising:
a memory device; and
a memory controller comprising a first interface, a second interface, a first data processor, and a second data processor,
wherein the first data processor is configured to perform a first data processing on read data retrieved via the first interface from the memory device and output first-processed read data via one of the second interface and the second data processor,
wherein the second data processor is configured to perform a second data processing on the first processed read data and output second-processed read data to an external host via the second interface, and
wherein the second data processor comprises a second error correction code (ECC) engine configured to perform a second ECC decoding on the first-processed read data received from the first data processor to provide the second-processed read data.

2. The memory system according to claim 1, wherein the first data processor comprises a first ECC engine and is configured such that the read data bypasses the first ECC engine to provide the first-processed read data.

3. The memory system according to claim 1, wherein the first data processor comprises a first ECC engine configured to perform a first ECC decoding on write data received via one of the second data processor and the second interface according to a first H-matrix, and
the second ECC engine performs the second ECC decoding based on a second H-matrix.

4. The memory system according to claim 1, wherein the first data processor comprises a first decryptor configured to perform a first decryption operation on the read data and to provide the first-processed read data to one of the external host via the second interface and the second data processor, and
wherein the second data processor comprises a second decryptor configured to perform a second decryption operation on the first-processed read data to provide the second-processed read data to the external host via the second interface.

5. The memory system according to claim 1, wherein the first data processor comprises a first calculator configured to perform a first calculation operation having first complexity on the read data, and to provide the first-processed read data to one of the external host via the second interface and the second data processor, wherein the second data processor comprises a second calculator configured to perform a second calculation operation having second complexity on the first-processed read data, to provide the second-processed read data to the external host via the second interface, and wherein the second complexity is higher than the first complexity.

6. The memory system according to claim 1, wherein the first data processor comprises a first de-randomizer configured to perform a first de-randomization operation on the read data, and to provide the first-processed read data to one of the external host via the second interface and the second data processor, and the second data processor comprises a second de-randomizer configured to perform a second de-randomization operation on the first-processed read data received from the first data processor, and to provide the second-processed read data to the external host via the second interface.

7. The memory system according to claim 1, wherein the first data processor is configured to perform a decompression operation on the read data, and to provide the first-processed read data to one of the external host via the second interface and the second data processor, and the second data processor is configured to perform a second decompression operation on the first-processed data received from the first data processor, and to provide the second-processed data to the external host via the second interface.

8. The memory system according to claim 1, wherein the memory controller is configured to determine whether a read operation requested by the external host is a normal read operation or a highly reliable read operation, upon determining that the read operation is the normal read operation, the memory controller configures a normal read operation path between the memory device and the external host, wherein the normal read operation path includes the first interface, the first data processor, and the second interface, upon determining that the read operation is the highly reliable read operation, the memory controller configures a highly reliable read operation path between the memory device and the external host, wherein the highly reliable read operation path includes the first interface, the first data processor, the second data processor, and the second interface.

9. A memory system comprising:
a memory device; and
a memory controller comprising a first interface connected to the memory device, a second interface connected to an external host, a first data processor including a first error correction code (ECC) engine and a second data processor including a second ECC engine,
wherein the memory controller is configured to determine whether a write operation requested from the external host is a normal write operation or a highly reliable write operation,
upon determining that the write operation is the normal write operation, the memory controller configures a normal write operation path from the external host to the memory device, wherein the normal write operation path includes the second interface, the first data processor, and the first interface, else upon determining that the write operation is the highly reliable write operation, the memory controller configures a highly reliable write operation path from the external host to the memory device, wherein the highly reliable write operation path includes the second interface, the second data processor, the first data processor, and the first interface.

10. The memory system according to claim 9, wherein the second ECC engine is configured to generate a second ECC encoded data by performing a second ECC encoding on write data received via the second interface from the external host, upon determining that the write operation is the highly reliable write operation.

11. The memory system according to claim 10, wherein the first ECC engine is configured to perform a first ECC encoding on the second ECC encoded data received from the second data processor upon determining that the write operation is the highly reliable write operation, and wherein the first ECC engine is configured to perform the first ECC encoding on the write data received via the second interface, upon determining that the write operation is the normal write operation.

12. The memory system according to claim 9, wherein the first data processor further comprises a first encryptor configured to perform a first encryption operation on write data received via the second interface from the external host, upon determining that the write operation is the normal write operation.

13. The memory system according to claim 9, wherein the second data processor further comprises a second encryptor configured to perform a second encryption operation on write data received via the second interface from the external host, upon determining that the write operation is the highly reliable write operation, and the first data processor further comprises a first encryptor configured to perform a first encryption operation on second-processed write data received from the second data processor based on the highly reliable write operation.

14. The memory system according to claim 9, wherein the first data processor further comprises a first randomizer configured to perform a first randomization operation on write data received via the second interface from the external host, upon determining that the write operation is the normal write operation.

15. The memory system according to claim 9, wherein the second data processor further comprises a second randomizer configured to perform a second randomization operation on write data received via the second interface from the external host, upon determining that the write operation is the highly reliable write operation, and wherein the first data processor further comprises a first randomizer configured to perform a first randomization operation on second-processed write data received from the second data processor based on the highly reliable write operation.

16. A method of operating a memory system comprising a field programmable gate array (FPGA), which is operated based on a program, and a memory device, the method comprising:

selecting one from a normal path and a highly reliable path to write first data to the memory device;

in response to selecting the highly reliable path, performing second error correction code (ECC) encoding on the first data, the second ECC encoding generating ECC parity bits varying based on the program;
performing first ECC encoding on the first data having undergone the second ECC encoding; and
storing the first data having undergone the first ECC encoding in the memory device according to a first writing method.

17. The method according to claim 16, wherein the performing of the second ECC encoding comprises performing the second ECC encoding based on a second H-matrix, and
wherein the performing of the first ECC encoding comprises performing the first ECC encoding based on a first H-matrix that is different from the second H-matrix.

18. The method according to claim 17, further comprising:
reading the first data stored in the memory device; and
performing ECC decoding on the read first data based on an FPGA H-matrix comprising the first H-matrix and the second H-matrix.

19. The method according to claim 16, further comprising:
changing the first writing method to a second writing method that is different from the first writing method;
changing the number of ECC parity bits based on the second writing method;
performing second ECC encoding on second data received from outside the memory system, the second ECC encoding generating the ECC parity bits changed in number thereof;
performing the first ECC encoding on the second data having undergone the second ECC encoding; and
storing the second data having undergone the first ECC encoding in the memory device according to the second writing method.

20. The method according to claim 19, wherein the first writing method is a data writing method by which n-bit data (where n is a positive integer equal to or greater than 2) is stored in each memory cell comprised in the memory device, and
wherein the second writing method is a data writing method by which (n−1)-bit data is stored in each memory cell comprised in the memory device.

* * * * *